(12) United States Patent
Nishida et al.

(10) Patent No.: US 9,394,607 B2
(45) Date of Patent: Jul. 19, 2016

(54) SUBSTRATE PROCESSING APPARATUS

(71) Applicant: Hitachi Kokusai Electric Inc., Tokyo (JP)

(72) Inventors: Masaya Nishida, Toyama (JP); Ryota Sasajima, Toyama (JP); Seiyo Nakashima, Toyama (JP); Tomoyasu Miyashita, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/667,323

(22) Filed: Mar. 24, 2015

(65) Prior Publication Data

US 2015/0267296 A1 Sep. 24, 2015

(30) Foreign Application Priority Data

Mar. 24, 2014 (JP) ................. 2014-060217

(51) Int. Cl.
*H01L 21/31* (2006.01)
*C23C 16/44* (2006.01)
*H01L 21/02* (2006.01)
*C23C 16/30* (2006.01)
*C23C 16/455* (2006.01)

(52) U.S. Cl.
CPC .............. *C23C 16/4409* (2013.01); *C23C 16/30* (2013.01); *C23C 16/4405* (2013.01); *C23C 16/4408* (2013.01); *C23C 16/45519* (2013.01); *C23C 16/45546* (2013.01); *C23C 16/45561* (2013.01); *C23C 16/45578* (2013.01); *H01L 21/0214* (2013.01); *H01L 21/02271* (2013.01)

(58) Field of Classification Search
CPC ... H01L 21/31; H01L 21/469; H01L 21/0214; H01L 21/02271
USPC ........................................................ 438/787
See application file for complete search history.

(56) References Cited

U.S. PATENT DOCUMENTS

| | | | |
|---|---|---|---|
| 2003/0206210 A1* | 11/2003 | Nakamura | B41J 2/01 347/30 |
| 2010/0136773 A1* | 6/2010 | Akae | C23C 16/4408 438/507 |
| 2013/0194350 A1* | 8/2013 | Watanabe | H01L 21/67051 347/54 |
| 2014/0176701 A1* | 6/2014 | Okuno | H01L 21/67288 348/125 |

FOREIGN PATENT DOCUMENTS

| | | |
|---|---|---|
| JP | 2000-223432 A | 8/2000 |
| JP | 2001-345276 A | 12/2001 |
| JP | 2003-158081 A | 5/2003 |
| JP | 2007-027599 A | 2/2007 |
| JP | 2009-231834 A | 10/2009 |

\* cited by examiner

*Primary Examiner* — Phuc Dang
(74) *Attorney, Agent, or Firm* — Volpe and Koenig, P.C.

(57) ABSTRACT

The present invention provides technology capable of suppressing a deposition of by-products in a substrate processing apparatus. When a process gas is supplied into a process vessel, an inert gas having a flow rate controlled by a flow rate controller is supplied to a first and second supply pipes through a third supply pipe, the inert gas of the first supply pipe is ejected into the process vessel by a first ejection part and the inert gas of the second supply pipe is ejected toward an inner wall surface by a second ejection part.

15 Claims, 13 Drawing Sheets

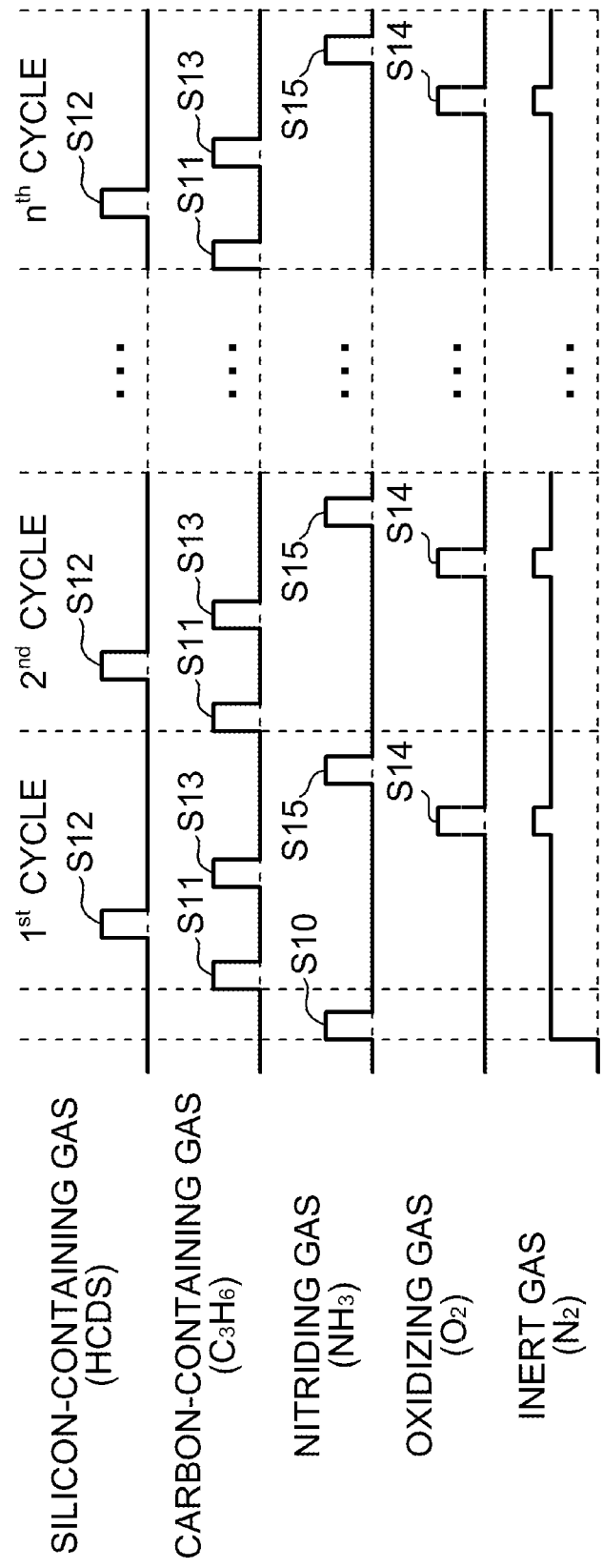

SUBSTRATE PROCESSING APPARATUS

CROSS-REFERENCE TO RELATED PATENT APPLICATION

This non-provisional U.S. patent application claims priority under 35 U.S.C. §119 of Japanese Patent Application No. 2014-060217, filed on Mar. 24, 2014, the entire contents of which are hereby incorporated by reference.

BACKGROUND OF THE INVENTION

1. Field of the Invention

The present invention relates to a substrate processing apparatus configured to perform a process on a substrate, a method of manufacturing a semiconductor device and a non-transitory computer-readable recording medium.

2. Description of the Related Art

For example, when a process such as film formation is performed on a substrate using a vertical semiconductor manufacturing device, by-products are adhered to the vicinity of a furnace port of the vertical semiconductor manufacturing device. By-products adhered to and deposited in the vicinity of the furnace port are removed by gas cleaning. However, it is difficult to remove by-products by gas cleaning, and complete removal of by-products is time-consuming. The by-products deposited in the vicinity of the furnace port ultimately become particles that cause low quality of film formation.

Patent Document 1 discloses exemplary gas cleaning in a vertical semiconductor manufacturing device.

RELATED ART DOCUMENT

Patent Document

1. Japanese Laid-open Patent Application No. 2009-231834

The present invention provides technology capable of suppressing deposition of by-products in a substrate processing apparatus.

SUMMARY OF THE INVENTION

According to an aspect of the present invention, there is provided a substrate processing apparatus including:
a process vessel configured to process a substrate;
a process gas supply system configured to supply a process gas into the process vessel;
an inert gas supply system configured to supply an inert gas into the process vessel;
a seal cap configured to close an opening of the process vessel; and
a controller configured to control the process gas supply system and the inert gas supply system,
wherein the inert gas supply system includes:
a first ejection part installed at a center portion of the seal cap and configured to eject the inert gas;
a second ejection part installed to face an inner wall surface of the opening at an end portion of the process vessel and configured to eject the inert gas;
a first supply pipe configured to supply the inert gas to the first ejection part;
a second supply pipe configured to supply the inert gas to the second ejection part;
a third supply pipe configured to supply the inert gas to the first pipe and the second pipe;
a flow rate controller installed at the third supply pipe and configured to control a flow rate of the inert gas; and
a throttle unit installed at at least one of the first supply pipe and the second supply pipe and configured to throttle a channel where the inert gas flows, and
wherein the controller is configured to control the process gas supply system and the inert gas supply system to: supply the inert gas having the flow rate thereof controlled by the flow rate controller to the first supply pipe and the second supply pipe through the third supply pipe; eject the inert gas supplied to the first supply pipe into the process vessel through the first ejection part installed at the center portion of the seal cap; and eject the inert gas supplied to the second supply pipe to the inner wall surface of the opening at the end portion of the process vessel through the second ejection part while the process gas is supplied into the process vessel.

BRIEF DESCRIPTION OF THE DRAWINGS

FIG. 12 is a diagram illustrating a gas supply timing in a first sequence of the present embodiment.

DETAILED DESCRIPTION OF THE PREFERRED EMBODIMENTS

(1) Configuration of Substrate Processing Apparatus

Figure 1:
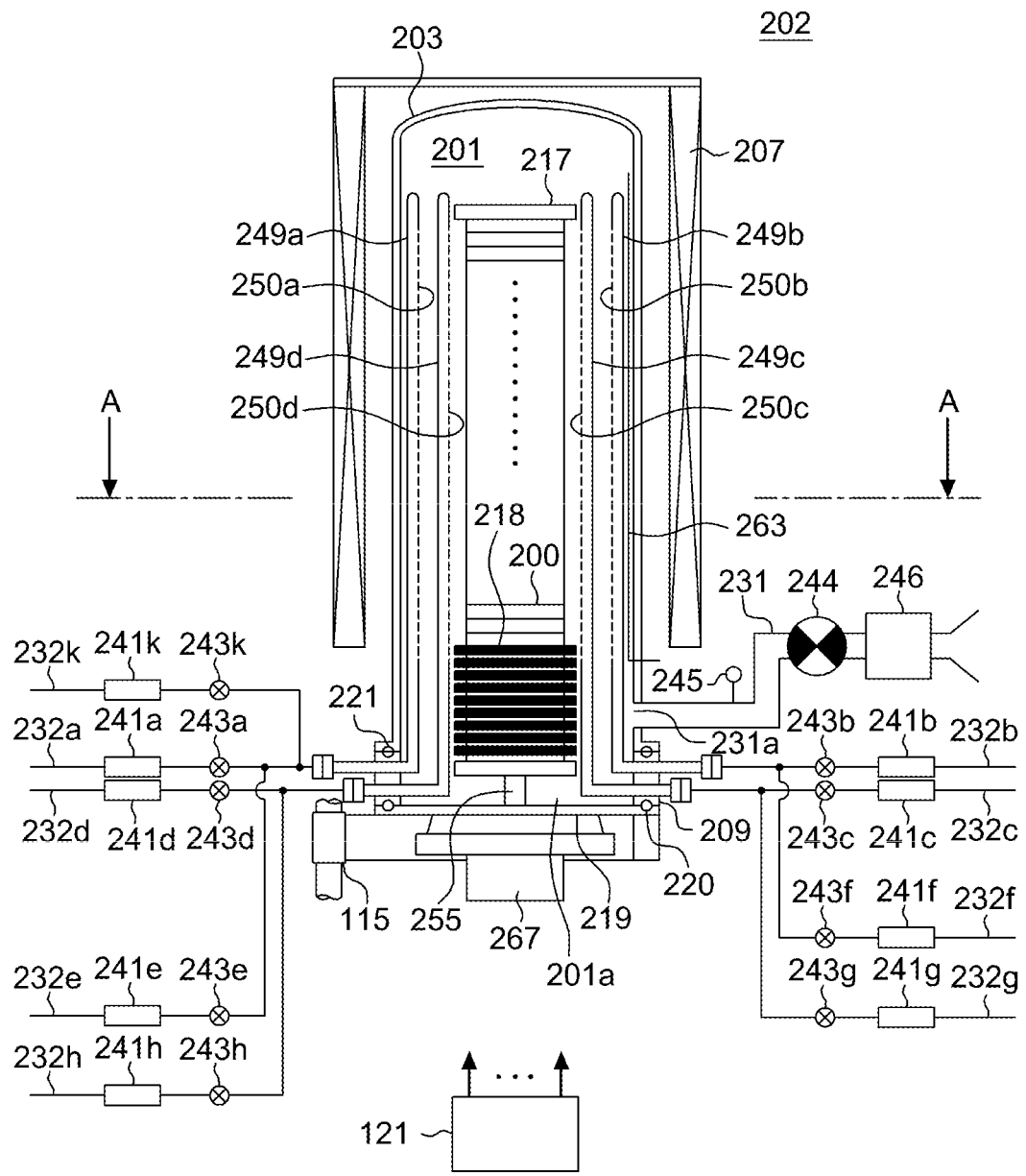
FIG. 1 is a vertical cross-sectional view of a configuration schematically illustrating a vertical processing furnace of the present embodiment.
Figure 2:
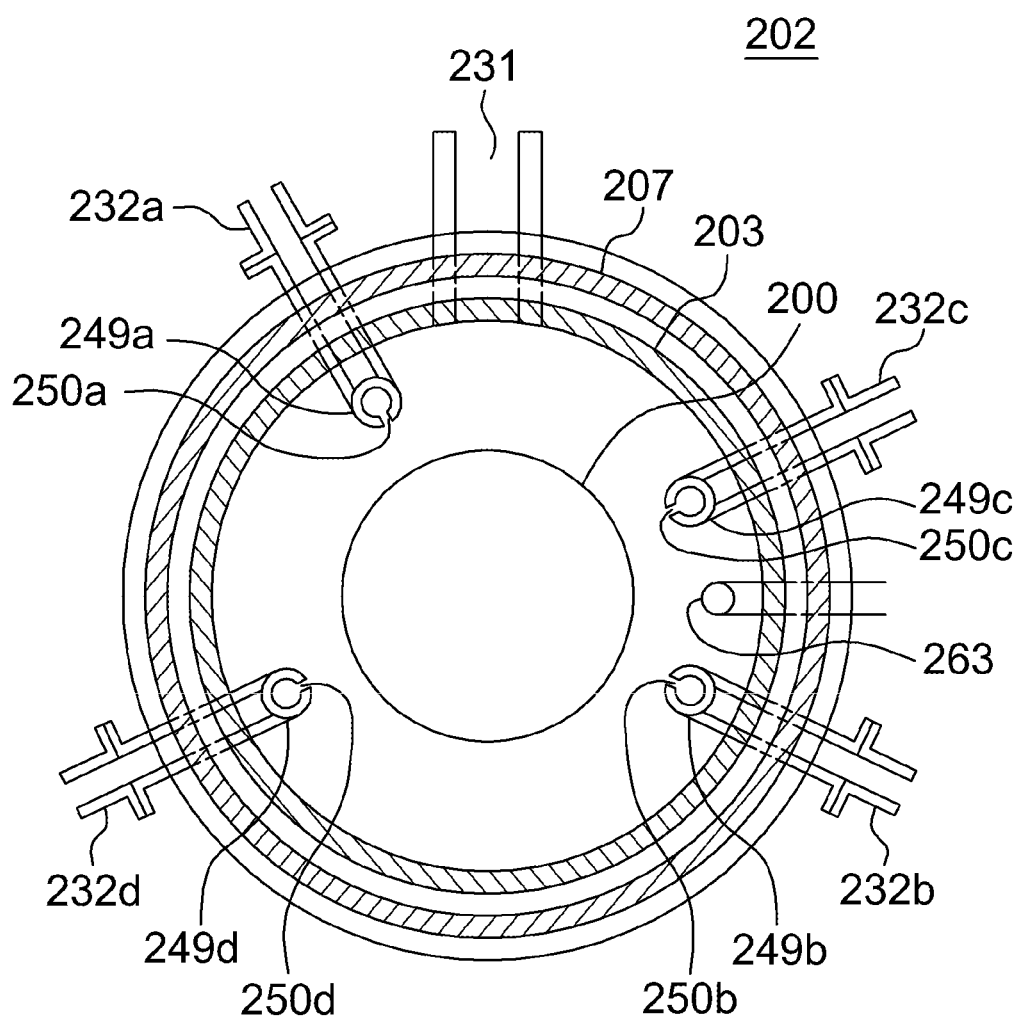
FIG. 2 is a transverse cross-sectional view of a configuration schematically illustrating the vertical processing furnace of the present embodiment and is a cross-sectional view taken along line A-A in FIG. 1.

As illustrated in FIGS. 1 and 2, a processing furnace 202 includes a heater 207 serving as a heating unit (heating mechanism). The heater 207 has a cylindrical shape and is vertically installed. Also, the heater 207 serves as an activating mechanism for thermally activating a gas in the processing furnace 202 as will be described below.

In the heater 207, a reaction tube 203 is concentrically provided with respect to the heater 207. The reaction tube 203 is made of a heat-resistant material such as quartz ($SiO_2$) or silicon carbide (SiC) and is formed in a cylindrical shape whose upper end is closed and lower end is opened. A process chamber 201 is formed in a cylindrical hollow portion of the reaction tube 203. The process chamber 201 is configured such that wafers 200 may be accommodated as substrates in a horizontal orientation to be arranged on multiple stages in a vertical direction by a boat 217 to be described below.

A manifold 209 that has a cylindrical shape and is made of a metal is provided below the reaction tube 203 to support the reaction tube 203. An O-ring 221 is provided at an upper surface of the manifold 209 as a seal member that abuts the lower end of the reaction tube 203. The reaction tube 203 and the manifold 209 constitute a process vessel (reaction container) in which the wafer 200 is processed. Also, an opening 201a of the end of the process vessel is defined by the manifold 209.

Also, a seal cap 219 capable of hermetically sealing the lower opening 201a of the process vessel is provided below the manifold 209 as a furnace port cover. The seal cap 219 is configured to abut a lower end of the manifold 209 in a vertical direction from a lower part thereof. The seal cap 219 is made of a metal such as stainless steel and has a disk shape. An O-ring 220 is provided at an upper surface of the seal cap 219 as a seal member that abuts the lower end of the manifold 209. The O-ring 220 includes an O-ring 220a and an O-ring 220b. Details will be described below with reference to FIG. 3.

A rotating mechanism 267 configured to rotate the boat 217 serving as a substrate support is provided below the seal cap 219 (a side opposite to the process chamber 201). The boat 217 will be described below. A rotational shaft 255 of the rotating mechanism 267 penetrates the seal cap 219, is connected to the boat 217 and supports the boat 217. The rotating mechanism 267 is provided at the rotational shaft 255. When the rotating mechanism 267 rotates the rotational shaft 255, that is, rotates the boat 217, the wafer 200 is rotated.

The seal cap 219 is vertically lifted by a boat elevator 115 serving as a lifting mechanism that is vertically installed outside of the reaction tube 203. The boat elevator 115 may load the boat 217 into the process chamber 201 by lifting the seal cap 219 and unload the boat 217 from the process chamber 201. That is, the boat elevator 115 constitutes a transfer device (transfer mechanism) configured to transfer the boat 217, that is, the wafer 200, inside or outside of the process chamber 201.

The boat 217 serving as a substrate support is made of a heat-resistant material such as quartz or SiC and is configured to support the plurality of wafers 200 on multiple stages that are arranged in a horizontal orientation while centers thereof are aligned. An insulation plate 218 serving as an insulating member made of a heat-resistant material such as quartz or SiC is provided below the boat 217. According to such a configuration, heat from the heater 207 is not easily transferred to the seal cap 219 side.

A temperature sensor 263 serving as a temperature detector is provided in the reaction tube 203. When a controller 121 to be described below regulates power supply to the heater 207 based on information on the temperature detected by the temperature sensor 263, the temperature in the process chamber 201 is set to have a desired temperature distribution. Similar to nozzles 249a through 249d, the temperature sensor 263 has an L shape and is provided along an inner wall of the reaction tube 203.

In the process chamber 201, the nozzles 249a through 249d are provided to penetrate the manifold 209. Gas supply pipes 232a through 232d are connected to the nozzles 249a through 249d, respectively.

In this manner, the four gas nozzles 249a through 249d are provided in the process chamber 201. The gas supply pipes 232a through 232d are connected to the gas nozzles, respectively. By these four gas nozzles and four gas supply pipes, it is possible to supply a plurality of types, four types of gases here, into the process chamber 201.

In the gas supply pipes 232a through 232d, in order from an upstream end of a gas flow, mass flow controllers (MFCs) 241a through 241d serving as flow rate controllers (flow rate control units) and valves 243a through 243d serving as on-off valves are provided. Also, inert gas supply pipes 232e through 232h are connected to a downstream side from the valves 243a through 243d of the gas supply pipes 232a through 232d, respectively. In the inert gas supply pipes 232e through 232h, in order from an upstream end, MFCs 241e through 241h and valves 243e through 243h are provided. Also, the above-described nozzles 249a through 249d are connected to leading ends of downstream sides of the gas supply pipes 232a through 232d, respectively.

The nozzles 249a through 249d are provided in a cylindrical space between the inner wall of the reaction tube 203 and the wafer 200 from a lower part to an upper part of the reaction tube 203 along the inner wall of the reaction tube 203 so as to rise in the direction in which the wafers 200 are stacked. That is, the nozzles 249a through 249d are provided along a wafer arrangement region in which the wafers 200 are arranged, in a region that horizontally surrounds the wafer arrangement region at sides of the wafer arrangement region. The nozzles 249a through 249d are configured as L-shaped long nozzles, and include a horizontal portion provided to penetrate a sidewall of the manifold 209 and a vertical portion provided from at least one end to the other end of the wafer arrangement region.

Gas supply holes 250a through 250d configured to supply a gas are provided at side surfaces of the nozzles 249a through 249d, respectively. Each of the gas supply holes 250a through 250d is open to a center of the reaction tube 203 and is able to supply a gas toward the wafer 200. The plurality of gas supply holes 250a through 250d are provided from the lower part to the upper part of the reaction tube 203, and each have the same opening area at the same opening pitch.

The gas supply pipes 232a through 232d, the MFCs 241a through 241d and the valves 243a through 243d mainly constitute a process gas supply system. Also, the nozzles 249a through 249d may be included in the process gas supply system. Also, the inert gas supply pipes 232e through 232h, the MFCs 241e through 241h and the valves 243e through 243h mainly constitute an inert gas supply system. The inert gas supply system serves as a process chamber purge gas supply system configured to supply a purge gas into the process chamber 201 above an exhaust port 231a. The purge gas is a gas that is used to discharge and remove a residual gas in the process chamber 201.

In this manner, in a gas supply method in the present embodiment, a gas is transferred through a longitudinally extending space having a cylindrical shape defined by the inner wall of the reaction tube 203 and ends of the plurality of stacked wafers 200, that is, the nozzles 249a through 249d disposed in the cylindrical space. Then, through the gas supply holes 250a through 250d that are open to the nozzles 249a through 249d, respectively, the gas is initially ejected into the reaction tube 203 in the vicinity of the wafer 200. A main flow of the gas in the reaction tube 203 is parallel to a surface of the wafer 200, that is, in a horizontal direction. In such a configuration, it is possible to uniformly supply the gas to each of the wafers 200, thereby uniformizing a film thickness of a thin film to be formed on each of the wafers 200.

A gas flowing along a surface of each of the wafers 200, that is, a residual gas after a reaction, flows toward the exhaust port 231a to be described below. In this case, the residual gas after the reaction flows in the vicinity of the manifold 209 disposed near the exhaust port 231a. In the substrate processing apparatus of the related art, by-products are adhered to and deposited on an inner wall 209a of the manifold 209. The by-products include the same component as a film formed on the surface of the wafer 200. However, since a temperature of the manifold 209 is lower than a temperature of the wafer 200, the by-products are easily detached due to low density. Therefore, the by-products cause particles. In the present embodiment, for example, when an inert gas flows in the vicinity of the manifold 209 through the inert gas supply system including a porous ring 41, deposition of the by-products is suppressed. A configuration of the inert gas supply system will be described below.

Through the gas supply pipe 232a, as a first-element-containing gas, for example, a silicon source gas such as a silane-based gas, that is, a gas (silicon-containing gas) that contains silicon (Si) as a first element, is supplied into the process chamber 201 through the MFC 241a, the valve 243a and the nozzle 249a. As the silicon-containing gas, for example, hexachlorodisilane ($Si_2Cl_6$, abbreviated to HCDS) gas may be used. Also, when a liquid source in a liquid state under room temperature and room pressure such as HCDS is used, the liquid source is vaporized by a vaporization system such as a vaporizer or a bubbler and is supplied as a source gas (HCDS gas).

Through the gas supply pipe 232b, as a second-element-containing gas, for example, a carbon-containing gas, that is, a gas that contains carbon (C) as a second element, is supplied into the process chamber 201 through the MFC 241b, the valve 243b and the nozzle 249b. As the carbon-containing gas, for example, a hydrocarbon-based gas such as propylene ($C_3H_6$) gas may be used.

Through the gas supply pipe 232c, as a third-element-containing gas, for example, an oxidizing gas, that is, a gas (oxygen-containing gas) that contains oxygen (O) as a third element, is supplied into the process chamber 201 through the MFC 241c, the valve 243c and the nozzle 249c. As the oxidizing gas, for example, oxygen ($O_2$) gas may be used.

Through the gas supply pipe 232d, as a fourth-element-containing gas, for example, a nitriding gas, that is, a gas (nitrogen-containing gas) that contains nitrogen (N) as a fourth element, is supplied into the process chamber 201 through the MFC 241d, the valve 243d and the nozzle 249d. As the nitriding gas, for example, ammonia ($NH_3$) gas may be used.

Through the inert gas supply pipes 232e through 232h, for example, nitrogen ($N_2$) gas is supplied into the process chamber 201 through the MFCs 241e through 241h, the valves 243e through 243h, the gas supply pipes 232a through 232d and the nozzles 249a through 249d.

When the above-described gas flows through each of the gas supply pipes, the gas supply pipe 232a, the MFC 241a and the valve 243a mainly constitute a first-element-containing gas supply system as a first gas supply system, that is, a silicon-containing gas supply system (silane-based gas supply system). The nozzle 249a may be included in the silicon-containing gas supply system.

Also, the gas supply pipe 232b, the MFC 241b and the valve 243b mainly constitute a second-element-containing gas supply system as a second gas supply system, that is, a carbon-containing gas supply system (hydrocarbon-based gas supply system). The nozzle 249b may be included in the carbon-containing gas supply system.

Also, the gas supply pipe 232c, the MFC 241c and the valve 243c mainly constitute a third-element-containing gas supply system as a third gas supply system, that is, an oxidizing gas supply system (oxygen-containing gas supply system). The nozzle 249c may be included in the oxidizing gas supply system.

Also, the gas supply pipe 232d, the MFC 241d and the valve 243d mainly constitute a fourth-element-containing gas supply system as a fourth gas supply system, that is, a nitriding gas supply system (nitrogen-containing gas supply system). The nozzle 249d may be included in the nitriding gas supply system.

Also, the first-element-containing gas supply system is called a source gas supply system or also simply called a source supply system. Also, when the carbon-containing gas, the oxidizing gas and the nitriding gas are collectively called a reactive gas, the carbon-containing gas supply system, the oxidizing gas supply system and the nitriding gas supply system constitute a reactive gas supply system.

The first gas supply system, the second gas supply system, the third gas supply system and the fourth gas supply system constitute the process gas supply system. Also, the above-described inert gas supply system constitutes the process chamber purge gas supply system. The process chamber purge gas supply system supplies the inert gas to the wafer arrangement region in which the wafers 200 are arranged in the process chamber 201.

Figure 3:
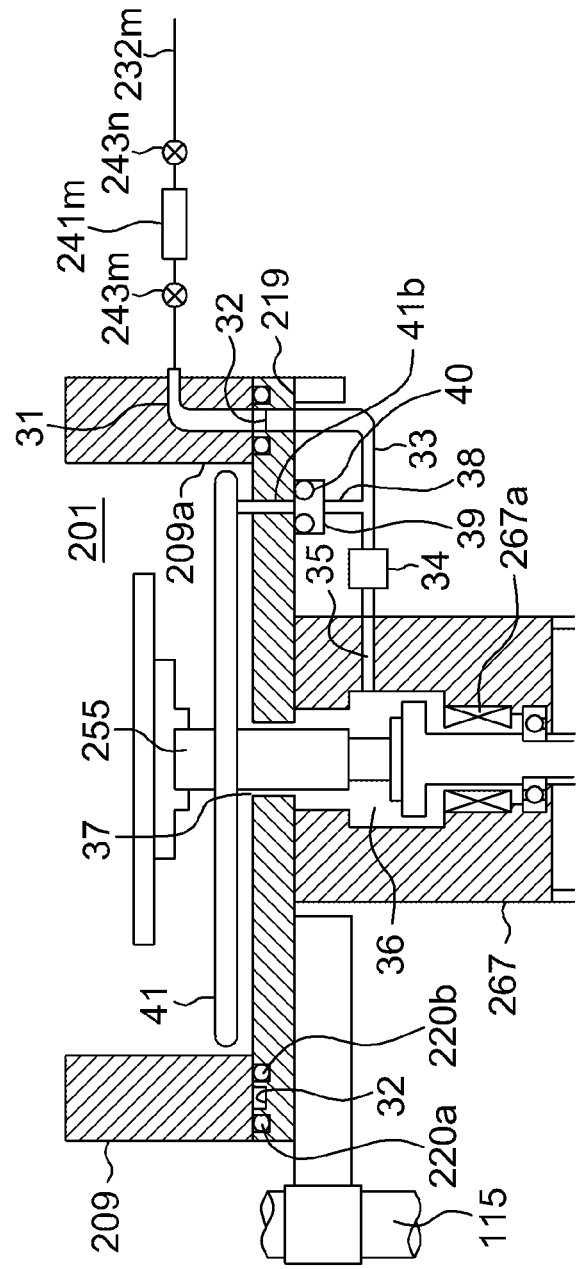
FIG. 3 is a vertical cross-sectional view of a configuration schematically illustrating the vicinity of a furnace port of the vertical processing furnace of the present embodiment.

As illustrated in FIG. 3, in the lower vicinity of the process chamber 201 in the process chamber 201, that is, in the lower vicinity of the manifold 209, the porous ring 41 of a hollow ring shape is provided. Also, the porous ring 41 may be provided to abut the seal cap 219 or may be provided to be buried in the seal cap 219. The porous ring 41 is provided to suppress deposition of the by-products onto the inner wall 209a of the manifold 209 by flowing the inert gas in the vicinity of the manifold 209 through a plurality of ejection holes 41a (refer to FIG. 4B) provided at the porous ring 41. A connection pipe 41b connected to the porous ring 41 is connected to a gas pipe 38 through a connection portion 39. The gas pipe 38 is connected to a gas pipe 33. The connection pipe 41b is provided to penetrate the seal cap 219 in a longitudinal direction. An O-ring 40 is provided at an upper part of the connection portion 39 and hermetically connects the connection pipe 41b and the gas pipe 38. A structure of the porous ring 41, the ejection hole 41a and the connection pipe 41b will be described below. Also, in FIG. 1, the porous ring 41, the connection pipe 41b, the connection portion 39, the gas pipe 38, a gas pipe 35, the gas pipe 33, a gas passage 31, an inert gas supply pipe 232m and members provided at these pipes will not be illustrated for easy understanding of FIG. 1.

The gas pipe 33 is connected to the gas passage 31 through a groove 32. The gas passage 31 is connected to the inert gas supply pipe 232m that is a supply pipe of a furnace port purge gas. The gas passage 31 is provided to penetrate an inside of the manifold 209. The groove 32 has a loop-shaped recess that is provided by cutting a part between the O-rings 220a and 220b of the seal cap 219 in a top view.

In the inert gas supply pipe 232m, in order from an upstream side of a gas flow, the valve 243n serving as an on-off valve, the MFC 241m serving as a flow rate controller (flow rate control unit) and the valve 243m serving as an on-off valve are provided.

The inert gas (for example, $N_2$ gas) supplied through the inert gas supply pipe 232m is supplied to the vicinity of the manifold 209 in the process chamber 201 through the porous ring 41 with the valve 243n, the MFC 241m, the valve 243m, the gas passage 31, the groove 32, the gas pipe 33, the gas pipe 38 and the connection pipe 41b therebetween. In this case, for example, the inert gas is sprayed to the inner wall surface 209a of the manifold 209. A flow rate of the inert gas flowing in the inert gas supply pipe 232m is controlled by the MFC 241m. In this manner, by flowing the inert gas in the vicinity of the manifold 209, the process gas in the vicinity of the furnace port 201a (that is, a loading and unloading port of the boat 217) that is an opening of the process vessel is purged (removed), and for example, the process gas in contact with the inner wall 209a of the manifold 209 is suppressed. As a result, deposition of by-products on the inner wall 209a and the like is suppressed.

As illustrated in FIG. 1, a process gas inlet port into the process chamber 201 is constituted by the gas supply holes 250a through 250d of the four nozzles 249a through 249d. Also, the exhaust port 231a configured to discharge a gas in the process chamber 201 is provided at a lower side of the process chamber 201, and a position of the exhaust port 231a is lower than a position of the process gas inlet port. Also, a position (a position of the manifold 209) of the opening 201a that is a substrate loading and unloading port of the process chamber 201 is lower than the position of the exhaust port 231a. Therefore, the process gas introduced into the process chamber 201 is likely to remain in the opening 201a below the exhaust port 231a. However, in the present embodiment, since the inert gas is supplied through the porous ring 41 that is lower than the exhaust port 231a and disposed in the vicinity of the opening 201a, the process gas in the vicinity of the furnace port is easily purged.

Also, as illustrated in FIG. 3, at a downstream side from a portion connecting the gas pipe 38 of the gas pipe 33, the gas pipe 35 branched from the gas pipe 33 is provided. In the gas pipe 35, a throttle unit 34 configured to throttle, that is, restrict, a flow rate of a gas flowing in the gas pipe 35 by throttling a channel in the gas pipe 35 is provided. A flow rate of a gas that may pass through the throttle unit 34 is lower than a flow rate of a gas that may pass through the gas pipe 35 itself or the gas pipe 38 itself. In this manner, when the throttle unit 34 is provided, a conductance in the gas pipe 35 may be lower than a conductance in the gas pipe 38.

As the throttle unit 34, for example, an orifice in which a flow rate is restricted in a fixed manner may be used. Instead of the orifice, a needle valve that may manually change a flow rate and the like may also be used. When the orifice is used as the throttle unit 34, an opening size (opening area) of a gas channel in the throttle unit 34 is fixed after the throttle unit 34 is provided in the gas pipe 35. However, when the needle valve and the like are used as the throttle unit 34, it is possible to change an opening size (opening area) of a gas channel in the throttle unit 34 even after the throttle unit 34 is provided in the gas pipe 35. That is, when the needle valve in which a degree of opening of a gas channel is variable is used as the throttle unit 34, it is possible to regulate a degree of opening of a gas channel in the throttle unit 34 even after the throttle unit 34 is provided in the gas pipe 35 and thus it is preferable.

A downstream end of the gas pipe 35 is open into a hollow portion 36 above a magnetic bearing 267a in the rotating mechanism 267. Therefore, the inert gas supplied into the hollow portion 36 through the gas pipe 35 is supplied into the process chamber 201 through a gap 37 between the seal cap 219 and the rotational shaft 255. As a result, corrosion of the rotating mechanism 267 due to leakage of the process gas in the process chamber 201 into the hollow portion 36 is suppressed.

In this case, when a throttle state of the above-described throttle unit 34 is within a predetermined range, the inert gas of an appropriate flow rate is supplied into the hollow portion 36 and the porous ring 41. That is, the inert gas of a flow rate that may suppress the process gas in the process chamber 201 from leaking into the hollow portion 36 is supplied into the hollow portion 36 and the inert gas of a flow rate that may suppress by-products from being deposited on the inner wall 209a of the manifold 209 is supplied into the porous ring 41.

In this manner, since the throttle unit 34 is provided, it is possible to control the flow rate of the inert gas in two gas supply lines (the gas pipe 35 and the gas pipe 38) by the one MFC 241m at an appropriate flow rate. As a result, it is possible to simplify a flow rate control system of the two gas supply lines, thereby reducing costs.

Also, the throttle unit 34 may not be provided in the gas pipe 35 but may be provided in the gas pipe 38 or may be provided in both the gas pipe 35 and the gas pipe 38. When the throttle unit 34 is provided in both the gas pipe 35 and the gas pipe 38, opening areas of the throttle units 34 are preferably different. For example, an opening area of the throttle unit 34 provided in the gas pipe 35 is preferably smaller than that of the throttle unit 34 provided in the gas pipe 38. In this manner, the throttle unit 34 is provided in at least one of the gas pipe 35 and the gas pipe 38.

The inert gas supply pipe 232m, the MFC 241m, the valves 243m and 243n, the gas passage 31, the groove 32, the gas pipes 33, 35 and 38, the throttle unit 34, the connection pipe 41b and the porous ring 41 mainly constitute the inert gas supply system configured to supply the inert gas that suppresses by-products from being deposited on the inner wall of the manifold 209 or suppresses the process gas from being introduced into the hollow portion 36. The inert gas supply system also serves as a furnace port portion purge gas supply system configured to supply the purge gas into the process chamber 201 below the exhaust port 231a, that is, into a furnace port portion.

Also, the hollow portion 36 and the gap 37 constitute the first ejection part that is provided at a center portion of the seal cap 219 and ejects the inert gas to a center portion of the seal cap 219. The gas pipe 35 is a first supply pipe configured to supply the inert gas to the first ejection part. The gap 37 is a first ejection port that is open upward in the process vessel.

Also, the porous ring 41 and the ejection hole 41a constitute a second ejection part that is provided at a position facing the inner wall surface 209a of the opening 201a of the end of the process vessel and ejects the inert gas to the inner wall surface 209a. The gas pipe 38 is a second supply pipe configured to supply the inert gas to the second ejection part. A plurality of ejection holes 41a are provided in the porous ring 41 as will be described below with reference to FIG. 4 is a second ejection port that is open toward the inner wall surface 209a of the opening 201a of the end of the process vessel.

The inert gas supply pipe 232m is a third supply pipe configured to supply the inert gas to the first supply pipe (the gas pipe 35) and the second supply pipe (the gas pipe 38). Also, when the process gas is supplied into the process vessel, the inert gas having a flow rate that is controlled by the flow rate controller 241m is supplied to the first supply pipe and the second supply pipe through the third supply pipe. Also, the inert gas supplied to the first supply pipe is ejected into the process vessel through a center portion of the seal cap 219 by the first ejection part. Also, the inert gas supplied to the second supply pipe is ejected toward the inner wall surface 209a of the opening 201a of the end of the process vessel by the second ejection part.

Figure 10:
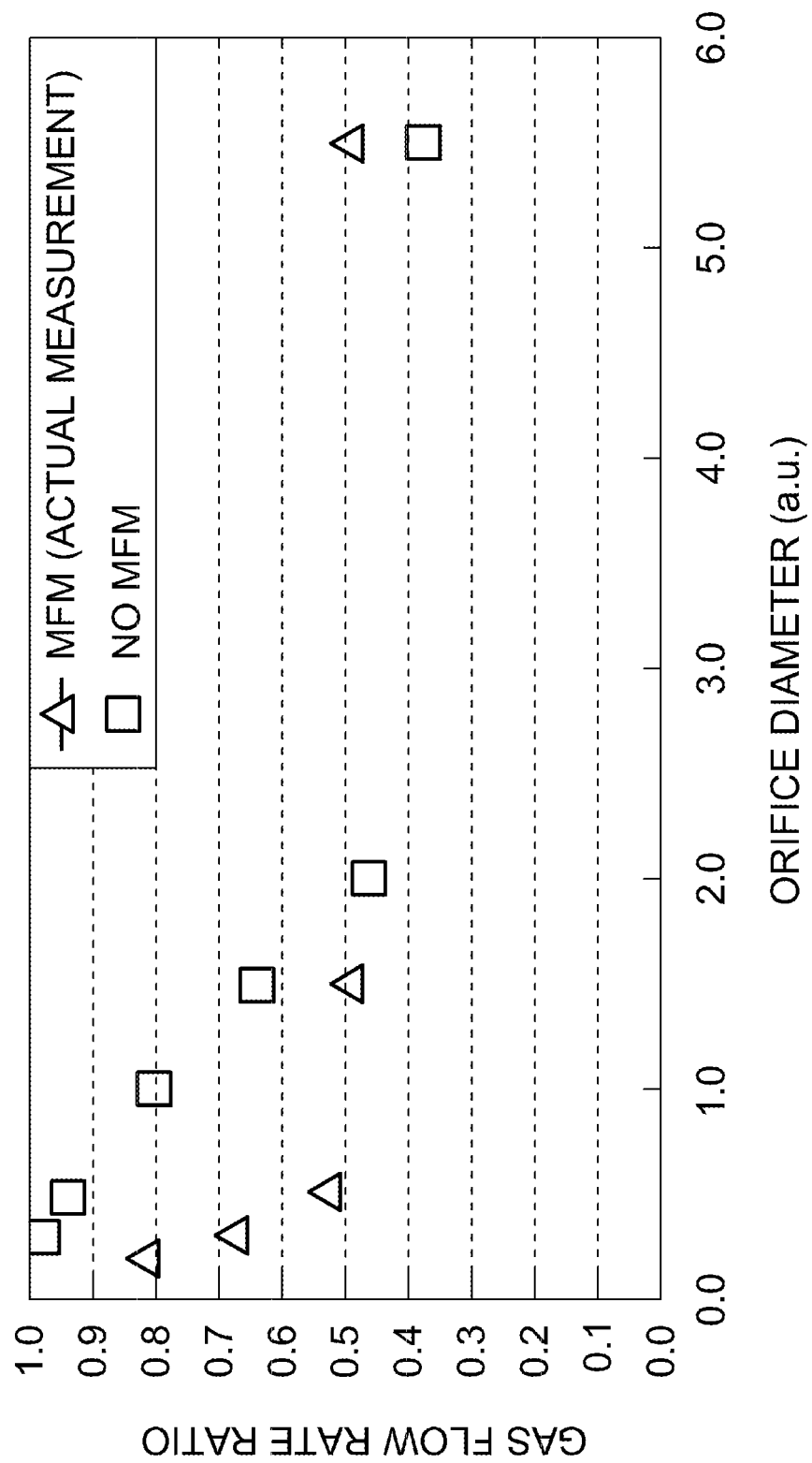
FIG. 10 is a diagram illustrating an inner diameter of a throttle unit and a ratio of a gas flow rate in the present embodiment.

FIG. 10 is a diagram illustrating an inner diameter of the orifice serving as the throttle unit 34 in the present embodiment and a ratio (hereinafter simply referred to as a gas flow rate ratio) of a flow rate of a gas flowing in the second supply pipe with respect to a flow rate of a gas flowing in the first supply pipe. The horizontal axis represents the inner diameter (any unit) of the orifice. The vertical axis represents a ratio of a flow rate of a gas ejected through the porous ring 41, that is, a flow rate of a gas flowing in the gas pipe 38 (the second supply pipe), with respect to a flow rate of a gas flowing in the gas pipe 35 (the first supply pipe). The mark "Δ" represents results obtained when a mass flow meter (MFM) is provided in both the gas pipe 35 and the gas pipe 38 and an inner diameter of the orifice and a gas flow rate ratio are actually measured.

In this case, with consideration of a conductance of the MFM itself, data when no MFM is provided in either of the gas pipe 35 and the gas pipe 38 is calculated from the actual measurement results obtained when the MFM is provided in both the gas pipe 35 and the gas pipe 38. The mark "□" represents the calculation result.

It can be understood in FIG. 10 that a gas flow rate ratio (a ratio of a gas flow rate flowing in the gas pipe 38 (the second supply pipe) with respect to a gas flow rate flowing in the gas pipe 35 (the first supply pipe)) decreases as the inner diameter of the orifice increases. That is, it can be understood that a flow rate of the inert gas flowing in the gas pipe 35 and the gas pipe 38 depends on the inner diameter of the orifice. Therefore, when the throttle unit 34 is used by the one MFC 241m, it is possible to control a flow rate of the inert gas in the two gas supply lines (the gas pipe 35 and the gas pipe 38) to an appropriate flow rate.

Figure 4A:
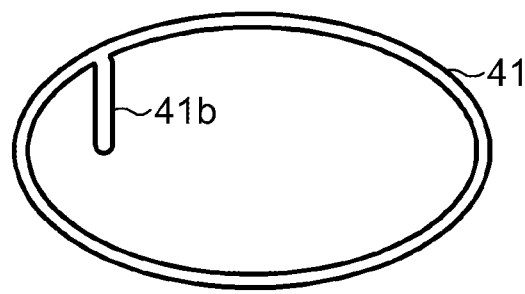
FIG. 4A is a perspective view of a structure of a porous ring of a first example in the present embodiment.
Figure 4B:
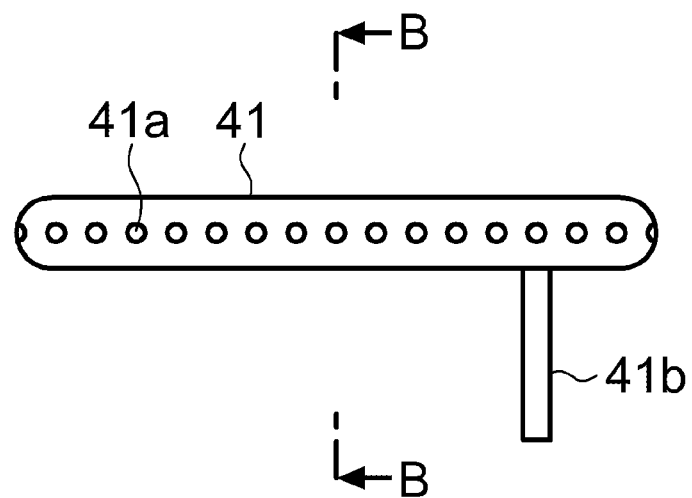
FIG. 4B is a diagram illustrating the porous ring in FIG. 4A seen from a horizontal direction.
Figure 4C:
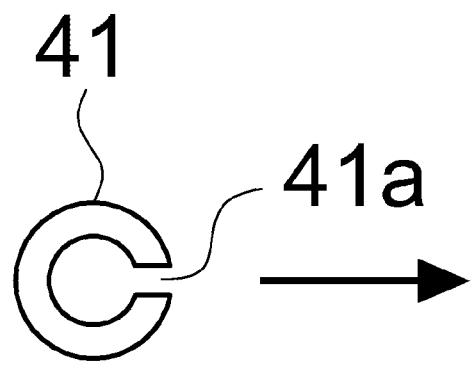
FIG. 4C is a vertical cross-sectional view of the porous ring in FIG. 4A.

FIGS. 4A through 4C illustrate a structure of a porous ring of a first example in the present embodiment. FIG. 4A is a perspective view of the porous ring 41 of the first example. FIG. 4B is a diagram illustrating the porous ring 41 in a horizontal direction. FIG. 4C is a vertical cross-sectional view of the porous ring 41. Also, the ejection hole 41a is not illustrated in FIG. 4A for convenience of description. As illustrated in FIGS. 4A through 4C, the porous ring 41 of the first example is configured as a hollow ring-shaped member, and is connected to the connection pipe 41b. The porous ring 41 is concentrically disposed with respect to the process vessel (the seal cap 219 or the manifold 209) in a plan view. The porous ring 41 includes a plurality of ejection holes 41a configured to eject the inert gas to an entire outer circumference of the porous ring 41 in a horizontal direction (lateral direction). Therefore, when the porous ring 41 of the first example is used, since it is possible to eject the inert gas to, in particular, the inner wall 209a of the manifold 209 (that is, a position of the inner wall 209a of the manifold 209 corresponding to a horizontal direction of the porous ring 41) at a position (that is, a position of a side of the porous ring 41) that is the same extent as a position of the porous ring 41 in a vertical direction, it is possible to suppress by-products from being deposited on the inner wall 209a of the manifold 209 at that position.

Figure 5A:
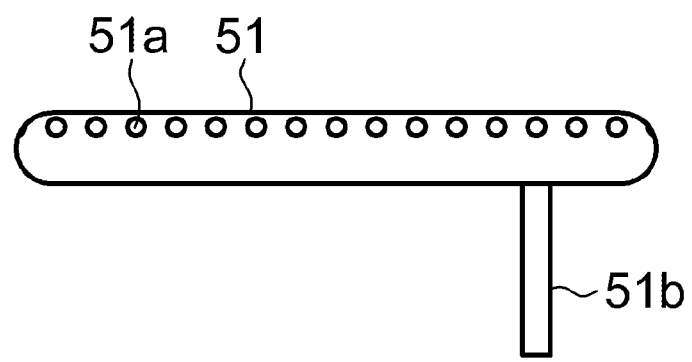
FIG. 5A is a diagram illustrating a porous ring of a second example in the present embodiment seen from a horizontal direction.
Figure 5B:
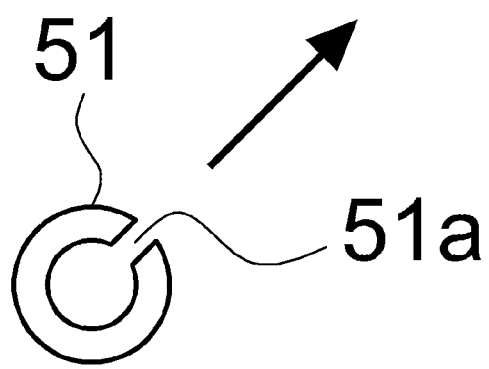
FIG. 5B is a vertical cross-sectional view of the porous ring in FIG. 5A.

FIGS. 5A and 5B illustrate a structure of a porous ring of a second example in the present embodiment. FIG. 5A is a diagram illustrating a porous ring 51 in the second example in a horizontal direction. FIG. 5B is a vertical cross-sectional view of the porous ring 51. As illustrated in FIGS. 5A and 5B, the porous ring 51 of the second example includes a plurality of ejection holes 51a configured to eject the inert gas to an entire outer circumference of the porous ring 51 in a diagonally upward direction of about 45° in the horizontal direction. Therefore, when the porous ring 51 of the second example is used, since it is possible to eject the inert gas to, in particular, the inner wall 209a of the manifold 209 in a diagonally upward direction of about 45° from the porous ring 51, it is possible to suppress by-products from being deposited on the inner wall 209a of the manifold 209 in that direction.

Figure 6A:
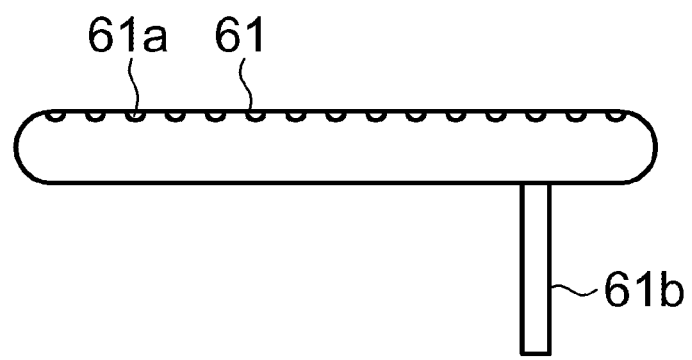
FIG. 6A is a diagram illustrating a porous ring of a third example in the present embodiment seen from a horizontal direction.
Figure 6B:
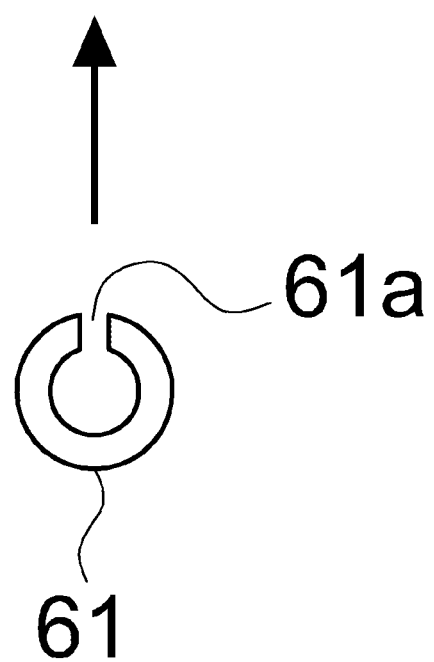
FIG. 6B is a vertical cross-sectional view of the porous ring in FIG. 6A.

FIGS. 6A and 6B illustrate a structure of a porous ring of a third example in the present embodiment. FIG. 6A is a diagram illustrating a porous ring 61 of the third example in a horizontal direction. FIG. 6B is a vertical cross-sectional view of the porous ring 61. As illustrated in FIGS. 6A and 6B, the porous ring 61 of the third example includes a plurality of ejection holes 61a configured to eject the inert gas to an entire outer circumference of the porous ring 61 in an upward direction (vertical direction). Therefore, when the porous ring 61 of the third example is used, since it is possible to extensively eject the inert gas to, in particular, the upper inner wall 209a of the manifold 209 from the porous ring 61, it is possible to suppress by-products from being deposited on the inner wall 209a of the manifold 209 in that direction.

Figure 7A:
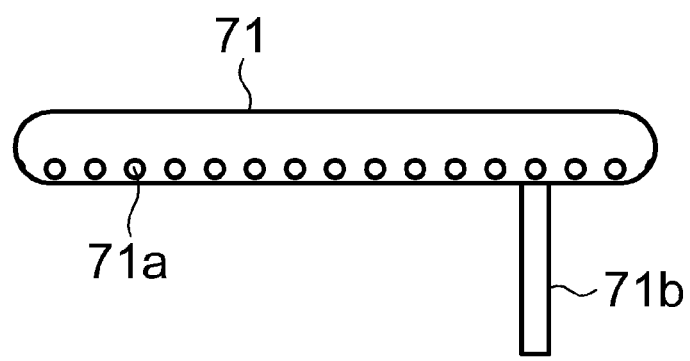
FIG. 7A is a diagram illustrating a porous ring of a fourth example in the present embodiment seen from a horizontal direction.
Figure 7B:
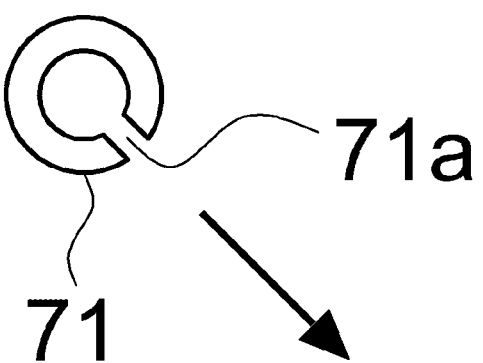
FIG. 7B is a vertical cross-sectional view of the porous ring in FIG. 7A.

FIGS. 7A and 7B illustrate a structure of a porous ring of a fourth example in the present embodiment. FIG. 7A is a diagram illustrating a porous ring 71 of the fourth example in a horizontal direction. FIG. 7B is a vertical cross-sectional view of the porous ring 71. As illustrated in FIGS. 7A and 7B, the porous ring 71 of the fourth example includes a plurality of ejection holes 71a configured to eject the inert gas to an entire outer circumference of the porous ring 71 in a diagonally downward direction of about 45° in the horizontal direction. Therefore, when the porous ring 71 of the fourth example is used, since it is possible to eject the inert gas to, in particular, the inner wall 209a of the manifold 209 in a diagonally downward direction of about 45° from the porous ring 71, it is possible to suppress by-products from being deposited on the inner wall 209a of the manifold 209 in that direction.

Figure 8A:
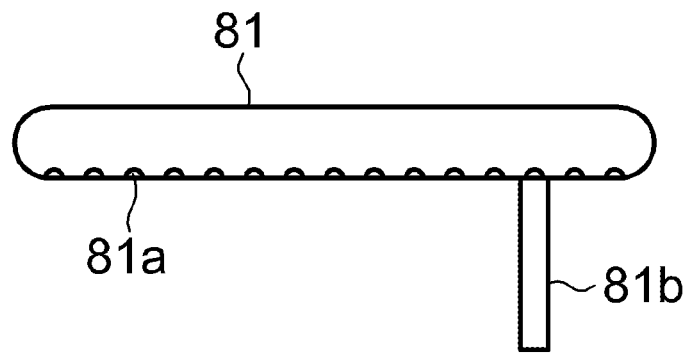
FIG. 8A is a diagram illustrating a porous ring of a fifth example in the present embodiment seen from a horizontal direction.
Figure 8B:
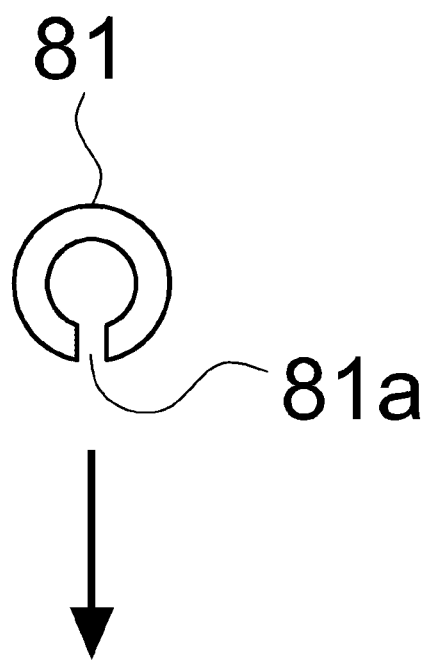
FIG. 8B is a vertical cross-sectional view of the porous ring in FIG. 8A.

FIGS. 8A and 8B illustrate a structure of a porous ring of a fifth example in the present embodiment. FIG. 8A is a diagram illustrating a porous ring 81 of the fifth example in a horizontal direction. FIG. 8B is a vertical cross-sectional view of the porous ring 81. As illustrated in FIGS. 8A and 8B, the porous ring 81 of the fifth example includes a plurality of ejection holes 81a configured to eject the inert gas to an entire outer circumference of the porous ring 81 in a downward direction (vertical direction). Therefore, when the porous ring 81 of the fifth example is used, since it is possible to extensively eject the inert gas to, in particular, the lower inner wall 209a of the manifold 209 from the porous ring 81, it is possible to suppress by-products from being deposited on the inner wall 209a of the manifold 209 in that direction.

Figure 9A:
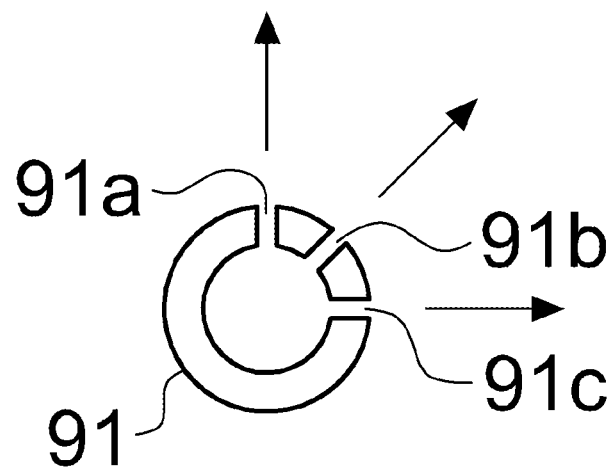
FIG. 9A is a vertical cross-sectional view of another structure of the porous ring in the present embodiment.
Figure 9B:
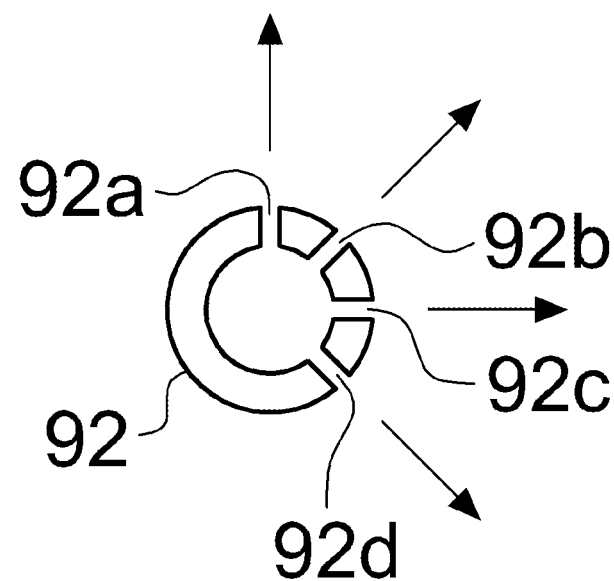
FIG. 9B is a vertical cross-sectional view of another structure of the porous ring in the present embodiment.
Figure 9C:
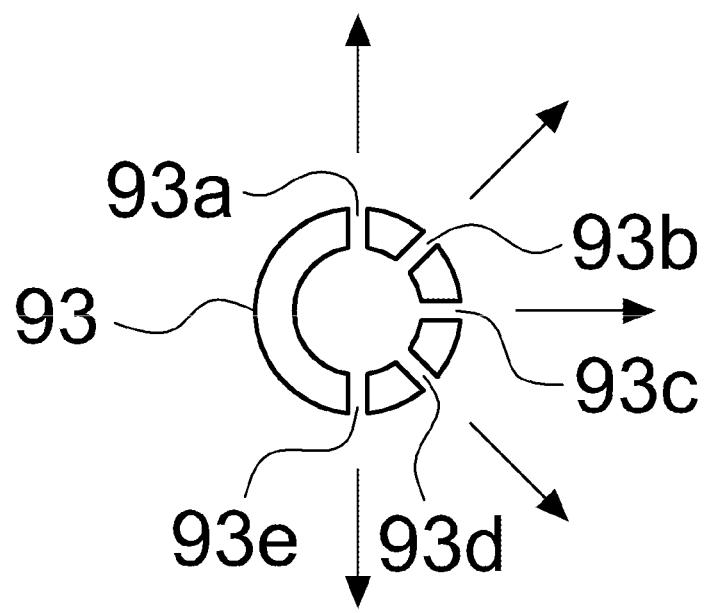
FIG. 9C is a vertical cross-sectional view of another structure of the porous ring in the present embodiment.

FIGS. 9A through 9C illustrate another structure of the porous ring in the present embodiment. FIG. 9A is a vertical cross-sectional view of a porous ring 91 and is a diagram illustrating a case in which the ejection holes 41a illustrated in FIGS. 4B and 4C, the ejection holes 51a illustrated in FIGS. 5A and 5B and the ejection holes 61a illustrated in FIGS. 6A and 6B are provided in the one porous ring 91 as ejection holes 91c, 91b and 91a. Therefore, when the porous ring 91 is used, since it is possible to eject the inert gas to, in particular, the inner wall 209a of the manifold 209 in a horizontal direction of the porous ring 91, the inner wall 209a of the manifold 209 in a diagonally upward direction of about 45° from the porous ring 91 and the upper inner wall 209a of the manifold 209 from the porous ring 91, it is possible to suppress by-products from being deposited on the inner wall 209a of the manifold 209 in each direction.

FIG. 9B is a vertical cross-sectional view of a porous ring 92 and is a diagram illustrating the porous ring 92 in which the ejection holes 71a illustrated in FIGS. 7A and 7B are further provided in the porous ring 91 of FIG. 9A to include ejection holes 92c, 92b, 92a and 92d. Therefore, when the porous ring 92 is used, since it is possible to further eject the inert gas to the inner wall 209a of the manifold 209 in a diagonally downward direction of about 45° from the porous ring 92 in addition to effects of the porous ring 91, it is possible to suppress by-products from being deposited on the inner wall 209a of the manifold 209 in each direction.

FIG. 9C is a vertical cross-sectional view of a porous ring 93 and is a diagram illustrating the porous ring 93 in which the ejection holes 81a illustrated in FIGS. 8A and 8B are further provided in the porous ring 92 of FIG. 9B to include ejection holes 93c, 93b, 93a, 93d and 93e. Therefore, when the porous ring 93 is used, since it is possible to further eject the inert gas to the lower inner wall 209a of the manifold 209 from the porous ring 93 in addition to effects of the porous ring 92, it is possible to suppress by-products from being deposited on the inner wall 209a of the manifold 209 in each direction.

As illustrated in FIG. 1, the exhaust port 231a configured to discharge an atmosphere (gas) in the process chamber 201 is provided in the reaction tube 203. An exhaust pipe 231 is connected to the exhaust port 231a. In the exhaust pipe 231, in order from an upstream side of a gas flow, a pressure sensor 245 serving as a pressure detector (pressure detecting unit) configured to detect a inner pressure of the process chamber 201, an auto pressure controller (APC) valve 244 serving as a pressure regulator (pressure regulating unit) and a vacuum pump 246 serving as a vacuum exhaust device are provided.

The APC valve 244 is a valve that may perform vacuum exhaust and vacuum exhaust stop in the process chamber 201 by opening or closing the valve while the vacuum pump 246 is operated, and regulate a inner pressure of the process chamber 201 by adjusting a degree of opening of the valve while the vacuum pump 246 is operated.

The exhaust port 231a, the exhaust pipe 231, the APC valve 244 and the pressure sensor 245 mainly constitute an exhaust system. Also, the vacuum pump 246 may be included in the exhaust system. The controller 121 performs control such that a inner pressure of the process chamber 201 becomes a predetermined pressure (degree of vacuum) by adjusting a degree of opening of the APC valve 244 based on information on the pressure detected by the pressure sensor 245 while the vacuum pump 246 is operated.

Figure 11:
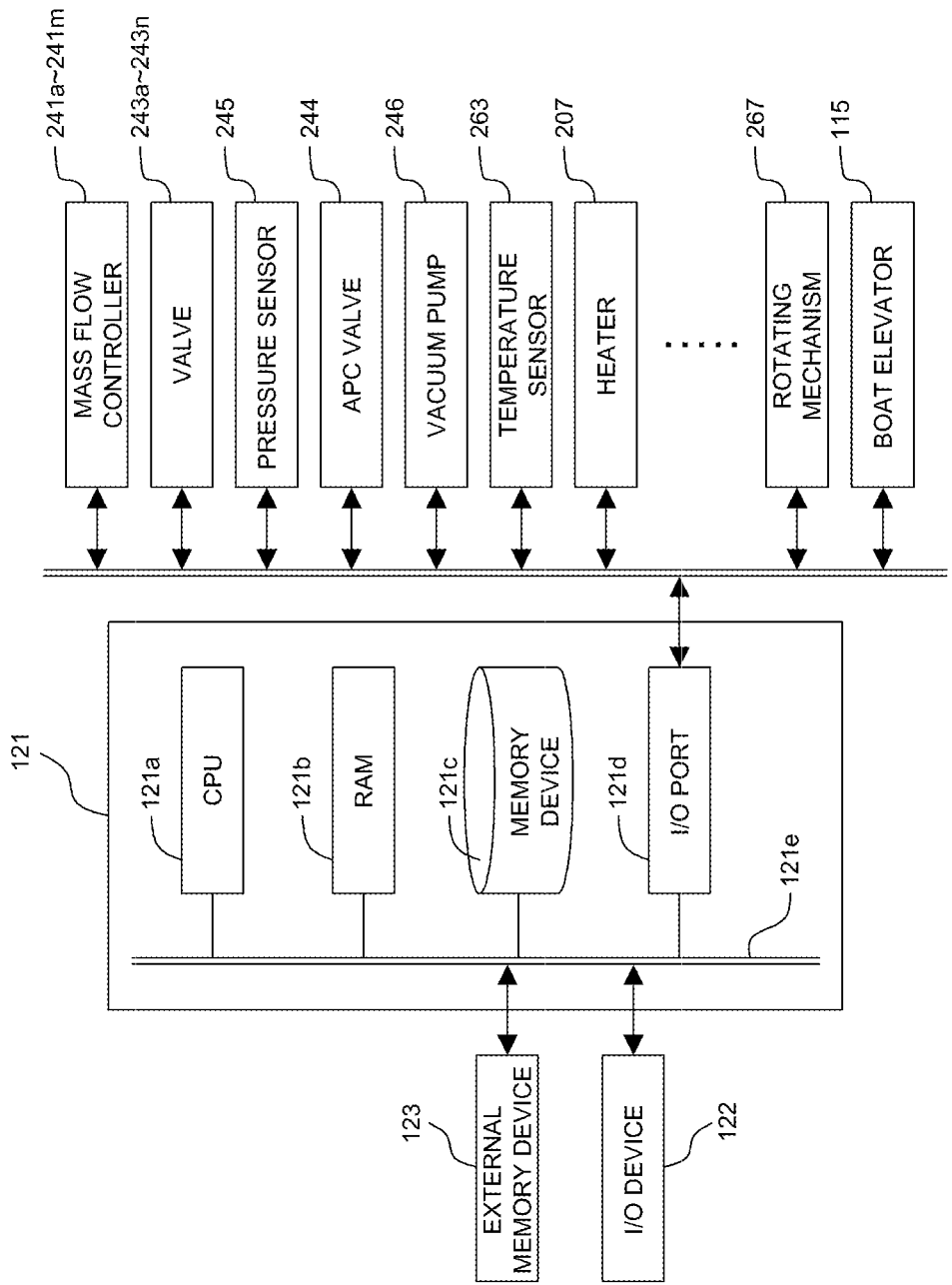
FIG. 11 is a configuration diagram schematically illustrating a controller used in the present embodiment.

As illustrated in FIG. 11, the controller 121 serving as a control unit (control device) is configured as a computer that includes a central processing unit (CPU) 121a, a random access memory (RAM) 121b, a memory device 121c and an I/O port 121d. The RAM 121b, the memory device 121c and the I/O port 121d are configured to exchange data with the CPU 121a through an internal bus 121e. An I/O device 122 configured as, for example, a touch panel, is connected to the controller 121.

The memory device 121c includes, for example, a flash memory or a hard disk drive (HDD). A control program controlling operations of the substrate processing apparatus, a process recipe describing sequences or conditions of substrate processing to be described below and the like are readably stored in the memory device 121c. Also, the process recipe, which is a combination of sequences, causes the controller 121 to execute each sequence in a substrate processing process to be described below in order to obtain a predetermined result, and functions as a program. Hereinafter, such a process recipe, a control program, and the like are collectively simply called a "program." Also, when the term "program" is used in this specification, it may refer to either or both of the process recipe and the control program. Also, the RAM 121b is configured as a memory area (work area) in which a program, data, and the like read by the CPU 121a are temporarily stored.

The I/O port 121d is connected to the MFCs 241a through 241m, the valves 243a through 243n, the pressure sensor 245, the APC valve 244, the vacuum pump 246, the heater 207, the temperature sensor 263, the rotating mechanism 267, the boat elevator 115 and the like.

The CPU 121a reads and executes the control program from the memory device 121c and reads the process recipe from the memory device 121c according to an input of a manipulating command from the I/O device 122. Also, to comply with the contents of the read process recipe, the CPU 121a is configured to control a flow rate regulating operation of various gases by the MFCs 241a through 241m, an opening or closing operation of the valves 243a through 243n, an opening or closing operation of the APC valve 244, a pressure regulating operation by the APC valve 244 based on the pressure sensor 245, starting and stopping of the vacuum pump 246, a temperature regulating operation of the heater 207 based on the temperature sensor 263, a rotation and rotational speed regulating operation of the boat 217 by the rotating mechanism 267, a lifting operation of the boat 217 by the boat elevator 115 and the like.

Also, the controller 121 is not limited to being configured as a dedicated computer but may be configured as a general-purpose computer. For example, the controller 121 according to this embodiment may be configured by preparing an external memory device 123 (for example, a magnetic tape, a magnetic disk such as a flexible disk and a hard disk, an optical disc such as a compact disc (CD) and a digital video disc (DVD), a magneto-optical disc such as an MO, and a semiconductor memory such as a Universal Serial Bus (USB) memory and a memory card) recording the above program, and then installing the program in the general-purpose computer using the external memory device 123. However, a method of supplying the program to the computer is not limited to using the external memory device 123. For example, a communication line such as the Internet or an exclusive line may be used to supply the program without using the external memory device. The memory device 121c or the external memory device 123 is configured as a non-transitory computer-readable recording medium. Hereinafter, these are also collectively simply called a recording medium. When the term "recording medium" is used in this specification, it refers to either or both of the memory device 121c and the external memory device 123.

(2) Substrate Processing Process

Next, as a process among manufacturing of a semiconductor apparatus (semiconductor device) using the above-described substrate processing apparatus, an exemplary sequence of forming a thin film on a substrate will be described. Also, in the following description, operations of respective units constituting the substrate processing apparatus are controlled by the controller 121.

Also, in the present embodiment, supply conditions of a plurality of types of gases including a plurality of elements forming a thin film to be formed are controlled such that a composition ratio of the thin film to be formed becomes a stoichiometric composition or a predetermined composition ratio different from the stoichiometric composition. For example, supply conditions are controlled such that at least one element among the plurality of elements forming the thin film to be formed is greater than a stoichiometric composition compared to the other elements. Hereinafter, an exemplary sequence of performing film formation while a ratio of the plurality of elements forming the thin film to be formed, that is, a composition ratio of the thin film, is controlled will be described.

As illustrated in FIG. 12, first, a process of supplying the nitriding gas to the wafer 200 (S10) is performed in a film formation sequence of the present embodiment. Then, when a processing cycle is performed a predetermined number of times, a process of forming a thin film containing silicon, oxygen, carbon and nitrogen on the wafer 200 is performed. The cycle includes sequentially performing a process of supplying the carbon-containing gas to the wafer 200 (S11), a process of supplying the silicon-containing gas to the wafer 200 (S12), a process of supplying the carbon-containing gas to the wafer 200 (S13), a process of supplying the oxidizing gas to the wafer 200 (S14) and a process of supplying the nitriding gas to the wafer 200 (S15).

In this manner, in the process of forming a thin film of the present embodiment, before the processing cycle of the processes (S11 through S15) is performed a predetermined number of times, the outermost surface of the wafer 200 is modified by supplying the nitriding gas to the wafer 200 in the process (S10).

Next, when the carbon-containing gas is supplied to the wafer 200, a first carbon-containing layer is formed on a part of the outermost surface of the wafer 200 modified by the nitriding gas (S11). Next, when the silicon-containing gas is supplied to the wafer 200, a silicon-containing layer is formed on the outermost surface of the wafer 200 that is modified by the nitriding gas and has a part on which the first carbon-containing layer is formed (S12). Next, when the carbon-containing gas is supplied to the wafer 200, a second carbon-containing layer is formed on the silicon-containing layer (S13). Next, when the oxidizing gas is supplied to the wafer 200, a layer including the first carbon-containing layer, the silicon-containing layer and the second carbon-containing layer is oxidized to form a layer containing silicon, oxygen and carbon (S14). Next, when the nitriding gas is supplied to the wafer 200, the layer containing silicon, oxygen and carbon is nitrided to form a layer containing silicon, oxygen, carbon and nitrogen and the outermost surface thereof is modified (S15).

Also, the first carbon-containing layer is formed by adsorbing the carbon-containing gas onto a part of the outermost surface of the wafer 200 that is modified by the nitriding gas. Specifically, for example, at least a part of the first carbon-containing layer is formed by replacing a part of the nitriding gas adsorbed onto at least a part of the outermost surface of the wafer 200 modified by the nitriding gas with the carbon-containing gas.

Hereinafter, the film formation sequence of the present embodiment will be described in detail. Here, an example in which HCDS gas is used as the silicon-containing gas, $C_3H_6$ gas is used as the carbon-containing gas, $O_2$ gas is used as the oxidizing gas and $NH_3$ gas is used as the nitriding gas to form a silicon oxycarbonitride film (SiOCN film) containing silicon, oxygen, carbon and nitrogen on the wafer 200 by the film formation sequence in FIG. 12 will be described.

When the term "wafer" is used in this specification, it refers to "the wafer itself," or a "laminate (aggregate) of a wafer, a predetermined layer, film, and the like formed on a surface thereof," that is, the wafer refers to a wafer including a predetermined layer, film, and the like formed on a surface thereof. In addition, when the term "surface of the wafer" is used in this specification, it refers to "a surface (exposed surface) of the wafer itself" or "a surface of a predetermined layer, film, and the like formed on the wafer, that is, the outermost surface of the wafer as the laminate."

Therefore, when it is described in this specification that "a predetermined gas is supplied to the wafer," it means that "a predetermined gas is directly supplied to a surface (exposed surface) of the wafer itself" or "a predetermined gas is supplied to a layer, film, and the like formed on the wafer, that is, to the outermost surface of the wafer as the laminate." In addition, when it is described in this specification that "a predetermined layer (or film) is formed on the wafer," it means that "a predetermined layer (or film) is directly formed on a surface (exposed surface) of the wafer itself" or "a predetermined layer (or film) is formed on a layer, film, and the like formed on the wafer, that is, a predetermined layer (or film) is formed on the outermost surface of the wafer as the laminate."

Also, the terms "substrate" and "wafer" as used in this specification have the same meanings. Thus, the term "wafer" in the above description may be replaced with the term "substrate."

(Wafer Charging and Boat Loading)

When the plurality of wafers 200 are loaded (wafer charging) on the boat 217, the boat 217 supporting the plurality of wafers 200 is lifted by the boat elevator 115 and is loaded (boat loading) into the process chamber 201, as illustrated in FIG. 1. In this state, the lower end of the manifold 209 is sealed by the seal cap 219 through the O-ring 220.

(Pressure Regulation and Temperature Regulation)

Vacuum exhaust is performed by the vacuum pump 246 such that the inside of the process chamber 201 has a desired pressure (degree of vacuum). In this case, the inner pressure of the process chamber 201 is measured by the pressure sensor 245 and the APC valve 244 is feedback-controlled based on the measured pressure information (pressure regulation). Also, the vacuum pump 246 is continuously operated at least until processing on the wafer 200 is completed. Also, heating is performed by the heater 207 such that the inside of the process chamber 201 has a desired temperature. In this case, power supply to the heater 207 is feedback-controlled based on temperature information detected by the temperature sensor 263 such that the inside of the process chamber 201 has a desired temperature distribution (temperature regulation). Also, the heating of the inside of the process chamber 201 by the heater 207 is continuously performed at least until processing on the wafer 200 is completed. Next, the rotating mechanism 267 begins to rotate the boat 217 and the wafer 200 (wafer rotation). Also, the rotation of the boat 217 and the wafer 200 by the rotating mechanism 267 is continuously performed at least until processing on the wafer 200 is completed.

[SiOCN Film Forming Process]

Next, the following surface modifying step S10 is performed. Then, five operations to be described below, that is, steps S11 through S15, are sequentially performed to form the SiOCN film.

In the SiOCN film forming process, as described above, through the inert gas supply system serving as the furnace port portion purge gas supply system, the inert gas for a furnace port portion purge is ejected into the process vessel through a center portion of the seal cap 219, and is ejected toward the inner wall surface 209a of the opening 201a of the end of the process vessel. Therefore, introduction of the process gas into the rotating mechanism 267 is prevented and deposition of by-products on the inner wall 209a of the manifold 209 is suppressed. Also, supply of the inert gas through the furnace port portion purge gas supply system is continuously performed at least until processing on the wafer 200 is completed.

[Surface Modifying Step S10]

($NH_3$ Gas Supply)

The valve 243d is opened to flow $NH_3$ gas into the gas supply pipe 232d. $NH_3$ gas flowing in the gas supply pipe 232d has a flow rate that is regulated by the MFC 241d. $NH_3$ gas having the regulated flow rate is supplied into the process chamber 201 through the gas supply hole 250d of the nozzle 249d. $NH_3$ gas supplied into the process chamber 201 is thermally activated and is exhausted through the exhaust pipe 231. In this case, thermally activated $NH_3$ gas is supplied to the wafer 200.

In this case, at the same time, the valve 243h is opened to flow $N_2$ gas into the inert gas supply pipe 232h. $N_2$ gas flowing in the inert gas supply pipe 232h is supplied into the process chamber 201 along with $NH_3$ gas and is exhausted through the exhaust pipe 231. Also, in this case, in order to prevent $NH_3$ gas from being introduced into the nozzle 249a through 249c, the valves 243e through 243g are opened to flow $N_2$ gas into the inert gas supply pipes 232e through 232g. $N_2$ gas is supplied into the process chamber 201 through the gas supply pipes 232a through 232c and the nozzle 249a through 249c and is exhausted through the exhaust pipe 231.

When $NH_3$ gas is thermally activated and then supplied, the APC valve 244 is appropriately regulated such that the inner pressure of the process chamber 201 ranges, for example, from 1 Pa to 6,000 Pa. A flow rate of supplied $NH_3$ gas controlled by the MFC 241d ranges, for example, from 100 sccm to 10,000 sccm. A flow rate of supplied $N_2$ gas controlled by the MFCs 241e through 241h ranges, for example, from 100 sccm to 10,000 sccm. In this case, a partial pressure of $NH_3$ gas in the process chamber 201 ranges, for example, from 0.01 Pa to 5,941 Pa. A time for which $NH_3$ gas is supplied to the wafer 200, that is, a gas supply time (radiation time), ranges, for example, from 1 to 600 seconds.

Also, the gas supply time of $NH_3$ gas in the surface modifying step S10 is preferably longer than the gas supply time of $NH_3$ gas in step S15 to be described below. Therefore, it is possible to sufficiently perform a surface modifying process (to be described below) on the outermost surface of the wafer 200 before film formation. Also, in this case, a temperature of the heater 207 is set such that a temperature of the wafer 200 ranges, for example, from 250° C. to 700° C., and preferably, 300° C. to 650° C. Since $NH_3$ gas has a high reaction temperature does not easily react in the above wafer temperature, when the inner pressure of the process chamber 201 is a relatively high pressure as described above, it is possible to thermally activate $NH_3$ gas. Also, when $NH_3$ gas is thermally activated and then supplied, a soft reaction may be generated and thus surface modification to be described below may be softly performed.

When activated $NH_3$ gas is supplied to the outermost surface of the wafer 200 (an underlying surface when the SiOCN film is formed), the outermost surface of the wafer 200 is modified (surface modifying process). Specifically, when $NH_3$ gas is adsorbed onto the outermost surface of the wafer 200, an adsorption layer of $NH_3$ gas is formed on the outermost surface of the wafer 200. Also, in this case, when the outermost surface of the wafer 200 reacts with activated $NH_3$ gas and is nitrided, a layer containing Si—N bonds in the outermost surface of the wafer 200, that is, a nitride layer (silicon nitride layer) containing silicon (Si) and nitrogen (N), may be additionally formed. That is, both the nitride layer and the adsorption layer of $NH_3$ gas may be formed on the outermost surface of the wafer 200.

The adsorption layer of $NH_3$ gas includes a chemical adsorption layer in which gas molecules of $NH_3$ gas are continuous and a chemical adsorption layer in which gas molecules of $NH_3$ gas are discontinuous. That is, the adsorption layer of $NH_3$ gas includes a chemical adsorption layer that is formed of molecules of $NH_3$ gas and has a thickness of one molecular layer or less than one molecular layer. Also, molecules of $NH_3$ gas forming the adsorption layer of $NH_3$ gas include molecules in which a bond between N and H is partially broken ($N_xH_y$ molecules). That is, the adsorption layer of $NH_3$ gas includes a chemical adsorption layer in which molecules of $NH_3$ gas and/or $N_xH_y$ molecules are continuous and a chemical adsorption layer in which molecules of $NH_3$ gas and/or $N_xH_y$ molecules are discontinuous. Also, the nitride layer includes a continuous layer containing Si and N and a discontinuous layer. That is, the nitride layer includes a layer that includes Si—N bonds and has a thickness of less than one atomic layer to several atomic layers. Also, "layer having a thickness of less than one molecular layer" refers to a discontinuously formed molecular layer. "Layer having a thickness of one molecular layer" refers to a continuously formed molecular layer. Also, "layer having a thickness of less than one atomic layer" refers to a discontinuously formed atomic layer. "Layer having a thickness of one atomic layer" refers to a continuously formed atomic layer.

A state of the outermost surface of the wafer 200 after the surface modifying process becomes a surface state in which HCDS gas supplied in step S12 to be described below is easily adsorbed and Si is easily deposited. That is, $NH_3$ gas used in the surface modifying step S10 serves as an adsorption and deposition accelerating gas that accelerates adsorption or deposition of HCDS gas or Si on the outermost surface of the wafer 200.

(Residual Gas Removal)

Then, the valve 243d is closed to stop supply of $NH_3$ gas. In this case, while the APC valve 244 is opened, the inside of the process chamber 201 is vacuum-exhausted by the vacuum pump 246 and an unreacted gas remaining in the process chamber 201, $NH_3$ gas that has contributed to surface modification of the wafer 200 or reaction by-products are removed from the inside of the process chamber 201. Also, in this case, while the valves 243e through 243h are opened, supply of $N_2$ gas into the process chamber 201 continues. Therefore, it is possible to increase an effect of removing an unreacted gas remaining in the process chamber 201, $NH_3$ gas that has contributed to surface modification or reaction by-products from the inside of the process chamber 201.

Also, in this case, the gas remaining in the process chamber 201 may not be completely removed, and the inside of the process chamber 201 may not be completely purged. When an amount of the gas remaining in the process chamber 201 is small, there is no negative influence on step S11 performed thereafter. In this case, there is no need to set a flow rate of $N_2$ gas supplied into the process chamber 201 to be high. For example, when the same amount of $N_2$ gas as a volume of the reaction tube 203 (the process chamber 201) is supplied, it is possible to purge to the extent that there is no negative influence on step S11. When the inside of the process chamber 201 is not completely purged in this manner, a purge time may decrease and throughput may be improved. Also, it is possible to suppress unnecessary consumption of $N_2$ gas to a minimum.

As the nitriding gas, in addition to ammonia ($NH_3$) gas, diazene ($N_2H_2$) gas, hydrazine ($N_2H_4$) gas, $N_3H_8$ gas or the like may be used. As the inert gas, in addition to $N_2$ gas, rare gases such as Ar gas, He gas, Ne gas and Xe gas may be used.

[Step S11]

($C_3H_6$ Gas Supply)

The surface modifying step S10 ends, the residual gas in the process chamber 201 is removed, and then the valve 243b is opened to flow $C_3H_6$ gas into the gas supply pipe 232b. $C_3H_6$ gas flowing in the gas supply pipe 232b has a flow rate that is regulated by the MFC 241b. $C_3H_6$ gas having the regulated flow rate is supplied into the process chamber 201 through the gas supply hole 250b of the nozzle 249b. $C_3H_6$ gas supplied into the process chamber 201 is thermally activated and is exhausted through the exhaust pipe 231. In this case, thermally activated $C_3H_6$ gas is supplied to the wafer 200.

In this case, at the same time, the valve 243f is opened to flow $N_2$ gas into the inert gas supply pipe 232f. $N_2$ gas flowing in the inert gas supply pipe 232f is supplied into the process chamber 201 along with $C_3H_6$ gas and is exhausted through the exhaust pipe 231. Also, in this case, in order to prevent $C_3H_6$ gas from being introduced into the nozzles 249a, 249c and 249d, the valves 243e, 243g and 243h are opened to flow $N_2$ gas into the inert gas supply pipes 232e, 232g and 232h. $N_2$ gas is supplied into the process chamber 201 through the gas supply pipes 232a, 232c and 232d and the nozzles 249a, 249c and 249d and is exhausted through the exhaust pipe 231.

In this case, by appropriately adjusting the APC valve 244, the inner pressure of the process chamber 201 ranges, for example, from 1 Pa to 6,000 Pa. A flow rate of supplied $C_3H_6$ gas controlled by the MFC 241b ranges, for example, from 100 sccm to 10,000 sccm. A flow rate of supplied $N_2$ gas controlled by the MFCs 241e through 241h ranges, for example, from 100 sccm to 10,000 sccm. In this case, a partial pressure of $C_3H_6$ gas in the process chamber 201 ranges, for example, from 0.01 Pa to 5,941 Pa. A time for which $C_3H_6$ gas is supplied to the wafer 200, that is, a gas supply time (radiation time) ranges, for example, from 1 to 200 seconds, preferably 1 to 120 seconds, and more preferably 1 to 60 seconds. In this case, the temperature of the heater 207 is set such that a temperature of the wafer 200 ranges, for example, from of 250° C. to 700° C., and preferably 300° C. to 650° C. as in the surface modifying step S10. Also, when $C_3H_6$ gas is thermally activated and then supplied, a soft reaction may be generated and thus the first carbon-containing layer to be described below may be easily formed.

When thermally activated $C_3H_6$ gas is supplied to the wafer 200, the first carbon-containing layer is formed on a part of the outermost surface of the wafer 200 that is modified by $NH_3$ gas in the surface modifying step S10. At least a part of the first carbon-containing layer is formed by replacing a part of $NH_3$ gas adsorbed onto at least a part of the outermost surface of the wafer 200 modified by $NH_3$ gas in the surface modifying step S10 with $C_3H_6$ gas. That is, at least a part of the first carbon-containing layer is formed when a part of $NH_3$ gas forming the adsorption layer of $NH_3$ gas formed on the outermost surface of the wafer 200 in the surface modifying step S10 is desorbed from the outermost surface of the wafer 200 due to energy of activated $C_3H_6$ gas and then $C_3H_6$ gas is chemically adsorbed onto a part from which $NH_3$ gas of the outermost surface of the wafer 200 is desorbed. Also, in this case, the present invention is not limited to the chemical adsorption layer of $C_3H_6$ gas, but may include formation of a chemical adsorption layer of a material ($C_xH_y$) in which $C_3H_6$ is decomposed or a carbon layer (C layer). However, these layers may be included in a part of the first carbon-containing layer.

Also, in this case, without replacement of $NH_3$ gas, that is, without desorption of $NH_3$ gas in the outermost surface of the wafer 200, $C_3H_6$ gas is adsorbed onto a part of the outermost surface of the wafer 200. For example, a part of $C_3H_6$ gas supplied to the wafer 200 is adsorbed onto the adsorption layer of $NH_3$ gas formed on the outermost surface of the wafer 200 in the surface modifying step S10. Also, a part of $C_3H_6$ gas supplied to the wafer 200 is adsorbed onto the nitride layer formed on the outermost surface of the wafer 200 in the surface modifying step S10. Also, a part of $C_3H_6$ gas supplied to the wafer 200 may be adsorbed onto a part of the outermost surface of the wafer 200 in which the nitride layer or the adsorption layer of $NH_3$ gas is not formed. In this manner, $C_3H_6$ gas may be adsorbed without replacement of $NH_3$ gas in a part of the outermost surface of the wafer 200. However, a chemical adsorption layer of $C_3H_6$ gas formed in this manner may be included in a part of the first carbon-containing layer. Also, in this case, the present invention is not limited to the chemical adsorption layer of $C_3H_6$ gas, but may include formation of a chemical adsorption layer of a material ($C_xH_y$) in which $C_3H_6$ is decomposed or a carbon layer (C layer). However, these layers may be included in a part of the first carbon-containing layer.

Also, under the above-described process conditions, adsorption of $C_3H_6$ gas with replacement of $NH_3$ gas is not performed with respect to all $NH_3$ gas forming the adsorption layer of $NH_3$ gas but results in replacement of only a part thereof. That is, $NH_3$ gas forming the adsorption layer of $NH_3$ gas is not entirely replaced (is not desorbed), and a part thereof remains in an adsorption state. Also, in adsorption of $C_3H_6$ gas without replacement of $NH_3$ gas, continuous adsorption (saturated adsorption) completely covering the outermost surface of the wafer 200 is not performed but discontinuous adsorption (unsaturated adsorption) is performed. For this reason, the first carbon-containing layer formed in step S11 becomes a layer having a thickness of less than one molecular layer, that is, a discontinuous layer, and becomes a layer that covers only a part of the outermost surface of the wafer 200 modified by $NH_3$ gas in the surface modifying step S10. That is, a part of the outermost surface of the wafer 200 modified by $NH_3$ gas in the surface modifying step S10 is not covered by the first carbon-containing layer after the first carbon-containing layer is formed in step S11 but is exposed, and thus remains in a surface state in which HCDS gas supplied in step S12 to be described below is easily adsorbed and Si is easily deposited.

In order to not saturate an adsorption state of $C_3H_6$ gas in the outermost surface of the wafer 200, process conditions in step S11 are preferably set as the above-described process conditions. However, when the process conditions in step S11 are set as the following process conditions, it is easy to set an adsorption state of $C_3H_6$ gas in the wafer 200 the outermost surface as an unsaturated state.

Wafer temperature: 500° C. to 650° C.
Inner pressure of the process chamber: 133 Pa to 5,332 Pa
Partial pressure of $C_3H_6$ gas: 33 Pa to 5,177 Pa
Flow rate of supplied $C_3H_6$ gas: 1,000 sccm to 10,000 sccm
Flow rate of supplied $N_2$ gas: 300 sccm to 3,000 sccm
$C_3H_6$ gas supply time: 6 to 200 seconds.

(Residual Gas Removal)

After the first carbon-containing layer is formed, the valve 243b is closed to stop supply of $C_3H_6$ gas. In this case, while the APC valve 244 is opened, the inside of the process chamber 201 is vacuum-exhausted by the vacuum pump 246, and unreacted $C_3H_6$ gas remaining in the process chamber 201, reaction by-products, or $NH_3$ gas desorbed from the outermost surface of the wafer 200 are removed from the inside of the process chamber 201. Also, in this case, while the valves 243e through 243h are opened, supply of $N_2$ gas serving as the inert gas into the process chamber 201 continues. $N_2$ gas serves as the purge gas. Therefore, it is possible to increase an effect of removing unreacted $C_3H_6$ gas remaining in the process chamber 201, reaction by-products or $NH_3$ gas desorbed from the outermost surface of the wafer 200 from the inside of the process chamber 201.

Also, in this case, the gas remaining in the process chamber 201 may not be completely removed and the inside of the process chamber 201 may not be completely purged. When an amount of the gas remaining in the process chamber 201 is small, there is no negative influence on step S12 performed thereafter. In this case, there is no need to set a flow rate of $N_2$ gas supplied into the process chamber 201 to be high. For example, when the same amount of $N_2$ gas as a volume of the reaction tube 203 (the process chamber 201) is supplied, it is possible to purge to the extent that there is no negative influence on step S12. When the inside of the process chamber 201 is not completely purged in this manner, a purge time may decrease and throughput may be improved. Also, it is possible to suppress unnecessary consumption of $N_2$ gas to a minimum.

As the carbon-containing gas, in addition to propylene ($C_3H_6$) gas, a hydrocarbon-based gas such as acetylene ($C_2H_2$) gas or ethylene ($C_2H_4$) gas may be used.

[Step S12]

(HCDS Gas Supply)

Step S11 ends, the residual gas in the process chamber 201 is removed and then the valve 243a is opened to flow HCDS gas into the gas supply pipe 232a. HCDS gas flowing in the gas supply pipe 232a has a flow rate that is regulated by the MFC 241a. HCDS gas having the regulated flow rate is supplied into the process chamber 201 through the gas supply hole 250a of the nozzle 249a and is exhausted through the exhaust pipe 231. In this case, HCDS gas is supplied to the wafer 200.

In this case, at the same time, the valve 243e is opened to flow the inert gas such as $N_2$ gas into the inert gas supply pipe 232e. $N_2$ gas flowing in the inert gas supply pipe 232e has a flow rate that is regulated by the MFC 241e. $N_2$ gas having the regulated flow rate is supplied into the process chamber 201 along with HCDS gas and is exhausted through the exhaust pipe 231. Also, in this case, in order to prevent HCDS gas from being introduced into the nozzle 249b through 249d, the valves 243f through 243h are opened to flow $N_2$ gas into the inert gas supply pipes 232f through 232h. $N_2$ gas is supplied into the process chamber 201 through the gas supply pipes 232b through 232d and the nozzles 249b through 249d and is exhausted through the exhaust pipe 231.

In this case, by appropriately adjusting the APC valve 244, the inner pressure of the process chamber 201 ranges, for example, from 1 Pa to 2,666 Pa, and preferably 1 Pa to 1,333 Pa. A flow rate of supplied HCDS gas controlled by the MFC 241a ranges, for example, from 1 sccm to 1,000 sccm. A flow rate of supplied $N_2$ gas controlled by the MFCs 241e through 241h ranges, for example, from 100 sccm to 10,000 sccm. A time for which HCDS gas is supplied to the wafer 200, that is, a gas supply time (radiation time), ranges, for example, from 1 to 200 seconds, preferably 1 to 120 seconds, and more preferably 1 to 60 seconds. In this case, the temperature of the heater 207 is the same temperature as in step S11 and is set to a level at which a CVD reaction is generated in the process chamber 201, that is, is set such that a temperature of the wafer 200 ranges, for example, from of 250° C. to 700° C., and preferably from 300° C. to 650° C.

Also, when the temperature of the wafer 200 is less than 250° C., it is difficult for HCDS to be adsorbed onto the wafer 200, and a practical film formation rate may not be obtained. When the temperature of the wafer 200 is 250° C. or higher, it is possible to address this problem. Also, when the temperature of the wafer 200 is 300° C. or higher, it is possible for HCDS to be more sufficiently adsorbed onto the wafer 200, thereby obtaining a more sufficient film formation rate. Also, when the temperature of the wafer 200 is greater than 700° C., the CVD reaction becomes strong (an excessive gas-phase reaction is generated), film thickness uniformity is likely to be degraded and control thereof may be difficult. When the temperature of the wafer 200 is 700° C. or lower, it is possible to suppress degradation of film thickness uniformity and thus control thereof is possible. In particular, when the temperature of the wafer 200 is 650° C. or lower, a surface reaction is more dominant than a gas-phase reaction, film thickness uniformity is easily ensured and control thereof becomes easy. Therefore, the temperature of the wafer 200 ranges from 250° C. to 700° C., and preferably from 300° C. to 650° C.

The silicon-containing layer having a thickness of, for example, less than one atomic layer to several atomic layers is formed on the outermost surface of the wafer 200 that is modified by $NH_3$ gas in the surface modifying step S10 according to supply of HCDS gas and has a part in which the first carbon-containing layer is formed. Therefore, a first layer containing silicon and carbon, that is, a layer containing the first carbon-containing layer and the silicon-containing layer is formed on the outermost surface of the wafer 200. The silicon-containing layer may include either or both of an adsorption layer of HCDS gas or a silicon layer (Si layer). However, the silicon-containing layer is preferably a layer containing silicon (Si) and chlorine (Cl).

Here, the silicon layer generally refers to a continuous layer that is formed of silicon (Si), a discontinuous layer or a silicon thin film that is formed by these layers overlapping. Also, the continuous layer formed of Si may also be called a silicon thin film. Also, Si forming the silicon layer includes Si in which a bond with Cl is not completely broken.

Also, the adsorption layer of HCDS gas includes a chemical adsorption layer in which gas molecules of HCDS gas are continuous and a chemical adsorption layer in which gas molecules of HCDS gas are discontinuous. That is, the adsorption layer of HCDS gas includes a chemical adsorption layer that is formed of HCDS molecules and has a thickness of one molecular layer or less than one molecular layer. Also, HCDS ($Si_2Cl_6$) molecules forming the adsorption layer of HCDS gas include molecules in which a bond between Si and Cl is partially broken ($Si_xCl_y$ molecules). That is, the adsorption layer of HCDS includes a chemical adsorption layer in which $Si_2Cl_6$ molecules and/or $Si_xCl_y$ molecules are continuous and a chemical adsorption layer in which $Si_2Cl_6$ molecules and/or $Si_xCl_y$ molecules are discontinuous. Also, "layer having a thickness of less than one atomic layer" refers to a discontinuously formed atomic layer. "Layer having a thickness of one atomic layer" refers to a continuously formed atomic layer. Also, "Layer having a thickness of less than one molecular layer" refers to a discontinuously formed molecular layer. "Layer having a thickness of one molecular layer" refers to a continuously formed molecular layer.

Under conditions in which HCDS gas is self-decomposed (pyrolyzed), that is, conditions causing a pyrolysis reaction of HCDS, when Si is deposited on the wafer 200, the silicon layer is formed. Under conditions in which HCDS gas is not self-decomposed (pyrolyzed), that is, conditions that do not cause a pyrolysis reaction of HCDS, when HCDS gas is adsorbed onto the wafer 200, the adsorption layer of HCDS gas is formed. Forming the silicon layer on the wafer 200 is preferable since a film formation rate is higher when the silicon layer is formed on the wafer 200 than when the adsorption layer of HCDS gas is formed on the wafer 200.

When a thickness of the silicon-containing layer formed on the wafer 200 is greater than several atomic layers, a modification action in steps S14 and S15 to be described below does not influence the entire silicon-containing layer. Also, a minimum thickness of the silicon-containing layer that may be formed on the wafer 200 is less than one atomic layer. Therefore, the thickness of the silicon-containing layer is preferably less than one atomic layer to several atomic layers. Also, when the thickness of the silicon-containing layer is one atomic layer or less, that is, one atomic layer or less than one atomic layer, an effect of a modification reaction in steps S14 and S15 to be described below may relatively increase, and a time required for the modification reaction in steps S14 and S15 may be reduced. A time required for forming the silicon-containing layer in step S12 may be reduced. As a result, it is possible to reduce a processing time for performing one cycle, and a total processing time may thus be reduced. That is, it is possible to increase the film-forming rate. Also, when the thickness of the silicon-containing layer is one atomic layer or less, it is possible to increase controllability of film thickness uniformity.

(Residual Gas Removal)

After the silicon-containing layer is formed, the valve 243*a* of the gas supply pipe 232*a* is closed to stop supply of HCDS gas. In this case, while the APC valve 244 is opened, the inside of the process chamber 201 is vacuum-exhausted by the vacuum pump 246, and an unreacted gas remaining in the process chamber 201, HCDS gas that has contributed to formation of the silicon-containing layer or reaction by-products are removed from the inside of the process chamber 201. Also, in this case, while the valves 243*e* through 243*h* are opened, supply of $N_2$ gas serving as the inert gas into the process chamber 201 continues. $N_2$ gas serves as the purge gas. Therefore, it is possible to increase an effect of removing an unreacted gas remaining in the process chamber 201, HCDS gas that has contributed to formation of the silicon-containing layer or reaction by-products from the inside of the process chamber 201.

Also, in this case, the gas remaining in the process chamber 201 may not be completely removed, and the inside of the process chamber 201 may not be completely purged. When an amount of the gas remaining in the process chamber 201 is small, there is no negative influence on step S13 performed thereafter. In this case, there is no need to set a flow rate of $N_2$ gas supplied into the process chamber 201 to be high. For example, when the same amount of $N_2$ gas as a volume of the reaction tube 203 (the process chamber 201) is supplied, it is possible to purge to the extent that there is no negative influence on step S13. When the inside of the process chamber 201 is not completely purged in this manner, a purge time may decrease and throughput may be improved. Also, it is possible to suppress unnecessary consumption of $N_2$ gas to a minimum.

As the silicon-containing gas, an inorganic source gas such as hexachlorodisilane ($Si_2Cl_6$, abbreviated to HCDS) gas, tetrachlorosilane, that is, silicon tetrachloride ($SiCl_4$, abbreviated to STC) gas, trichlorosilane ($SiHCl_3$, abbreviated to TCS) gas, dichlorosilane ($SiH_2Cl_2$, abbreviated to DCS) gas, monochlorosilane ($SiH_3Cl$, abbreviated to MCS) gas or monosilane ($SiH_4$) gas, or an organic source gas such as aminosilane-based tetrakis(dimethylamino)silane ($Si[N(CH_3)_2]_4$, abbreviated to 4DMAS) gas, tris(dimethylamino)silane ($Si[N(CH_3)_2]_3H$, abbreviated to 3DMAS) gas, bis(diethylamino)silane ($Si[N(C_2H_5)_2]_2H_2$, abbreviated to 2DEAS) gas or bis(tertiary-butyl-amino)silane ($SiH_2[NH(C_4H_9)]_2$, abbreviated to BTBAS) gas may be used. As the inert gas, in addition to $N_2$ gas, rare gases such as Ar gas, He gas, Ne gas and Xe gas may be used.

[Step S13]

($C_3H_6$ Gas Supply)

Step S12 ends, the residual gas in the process chamber 201 is removed and then thermally activated $C_3H_6$ gas is supplied to the wafer 200. Process sequences and process conditions in this case are the same process sequences and process conditions when $C_3H_6$ gas is supplied in the above-described step S11.

In this case, a gas flowing in the process chamber 201 is thermally activated $C_3H_6$ gas, and no HCDS gas flows in the process chamber 201. Therefore, $C_3H_6$ gas does not cause a gas-phase reaction and is supplied to the wafer 200 in an active state. In this case, in step S12, on the silicon-containing layer formed on the wafer 200, a carbon-containing layer having a thickness of less than one molecular layer or less than one atomic layer, that is, a discontinuous carbon-containing layer, is formed as the second carbon-containing layer. Therefore, a second layer containing silicon and carbon, that is, a layer containing the first carbon-containing layer, the silicon-containing layer and the second carbon-containing layer, is formed on the outermost surface of the wafer 200. Also, depending on conditions, when a part of the silicon-containing layer reacts with $C_3H_6$ gas supplied in step S13 and thus the silicon-containing layer is modified (carbonized), the second layer containing silicon and carbon, that is, a layer containing the first carbon-containing layer and the modified (carbonized) silicon-containing layer, may be formed on the outermost surface of the wafer 200.

The second carbon-containing layer formed on the silicon-containing layer may be a chemical adsorption layer of the carbon-containing gas ($C_3H_6$ gas), a chemical adsorption layer of a material ($C_xH_y$) in which $C_3H_6$ is decomposed or a carbon layer (C layer). Here, a chemical adsorption layer of $C_3H_6$ or $C_xH_y$ needs to be a discontinuous chemical adsorption layer of $C_3H_6$ molecules or $C_xH_y$ molecules. Also, the carbon layer needs to be a discontinuous layer formed of carbon. Also, when the second carbon-containing layer formed on the silicon-containing layer is a continuous layer, for example, when an adsorption state of $C_3H_6$ or $C_xH_y$ in the silicon-containing layer is set as a saturated state and a continuous chemical adsorption layer of $C_3H_6$ or $C_xH_y$ is formed on the silicon-containing layer, an entire surface of the silicon-containing layer is covered by a chemical adsorption layer of $C_3H_6$ or $C_xH_y$. In this case, there is no silicon on a surface of the second layer (a layer containing the first carbon-containing layer, the silicon-containing layer and the second carbon-containing layer). As a result, an oxidation reaction of the second layer in step S14 to be described below or a nitriding reaction of a third layer in step S15 to be described below may be difficult. This is because nitrogen or oxygen binds to silicon, but does not easily bind to carbon under the above-described process conditions. In order to generate a desired oxidation reaction or nitriding reaction in step S14 or S15 to be described below, an adsorption state of $C_3H_6$ or $C_xH_y$ in the silicon-containing layer is set as an unsaturated state, and silicon needs to be exposed at the surface of the second layer.

In order to set an adsorption state of $C_3H_6$ or $C_xH_y$ in the silicon-containing layer as an unsaturated state, process conditions in step S13 are preferably set as the above-described process conditions. However, when the process conditions in step S13 are set as the following process conditions, it is easy to set an adsorption state of $C_3H_6$ or $C_xH_y$ in the silicon-containing layer as an unsaturated state.

Wafer temperature: 500° C. to 650° C.
Inner pressure of the process chamber: 133 Pa to 5,332 Pa
Partial pressure of $C_3H_6$ gas: 33 Pa to 5,177 Pa
Flow rate of supplied $C_3H_6$ gas: 1,000 sccm to 10,000 sccm
Flow rate of supplied $N_2$ gas: 300 sccm to 3,000 sccm
$C_3H_6$ gas supply time: 6 to 200 seconds.

(Residual Gas Removal)

The second carbon-containing layer is formed and then the valve 243b is closed to stop supply of $C_3H_6$ gas. In this case, while the APC valve 244 is opened, the inside of the process chamber 201 is vacuum-exhausted by the vacuum pump 246, and an unreacted gas remaining in the process chamber 201, $C_3H_6$ gas that has contributed to formation of the second carbon-containing layer or reaction by-products are removed from the inside of the process chamber 201. Also, in this case, while the valves 243e through 243h are opened, supply of $N_2$ gas serving as the inert gas into the process chamber 201 continues. $N_2$ gas serves as the purge gas. Therefore, it is possible to increase an effect of removing an unreacted gas remaining in the process chamber 201, $C_3H_6$ gas that has contributed to formation of the second carbon-containing layer or reaction by-products from the inside of the process chamber 201.

Also, in this case, the gas remaining in the process chamber 201 may not be completely removed, and the inside of the process chamber 201 may not be completely purged. When an amount of the gas remaining in the process chamber 201 is small, there is no negative influence on step S14 performed thereafter. In this case, there is no need to set a flow rate of $N_2$ gas supplied into the process chamber 201 to be high. For example, when the same amount of $N_2$ gas as a volume of the reaction tube 203 (the process chamber 201) is supplied, it is possible to purge to the extent that there is no negative influence on step S14. When the inside of the process chamber 201 is not completely purged in this manner, a purge time may decrease and throughput may be improved. Also, it is possible to suppress unnecessary consumption of $N_2$ gas to a minimum.

As the carbon-containing gas, in addition to propylene ($C_3H_6$) gas, a hydrocarbon-based gas such as acetylene ($C_2H_2$) gas or ethylene ($C_2H_4$) gas may be used.

[Step S14]

($O_2$ Gas Supply)

Step S13 ends, the residual gas in the process chamber 201 is removed and then the valve 243c is opened to flow $O_2$ gas into the gas supply pipe 232c. $O_2$ gas flowing in the gas supply pipe 232c has a flow rate that is regulated by the MFC 241c. $O_2$ gas having the regulated flow rate is supplied into the process chamber 201 through the gas supply hole 250c of the nozzle 249c. $O_2$ gas supplied into the process chamber 201 is thermally activated and is exhausted through the exhaust pipe 231. In this case, thermally activated $O_2$ gas is supplied to the wafer 200.

In this case, at the same time, the valve 243g is opened to flow $N_2$ gas into the inert gas supply pipe 232g. $N_2$ gas flowing in the inert gas supply pipe 232g is supplied into the process chamber 201 along with $O_2$ gas and is exhausted through the exhaust pipe 231. Also, in this case, in order to prevent $O_2$ gas from being introduced into the nozzles 249a, 249b and 249d, the valves 243e, 243f and 243h are opened to flow $N_2$ gas into the inert gas supply pipes 232e, 232f and 232h. $N_2$ gas is supplied into the process chamber 201 through the gas supply pipes 232a, 232b and 232d and the nozzles 249a, 249b and 249d and is exhausted through the exhaust pipe 231.

In this case, by appropriately adjusting the APC valve 244, the inner pressure of the process chamber 201 ranges, for example, from 1 Pa to 6,000 Pa. A flow rate of supplied $O_2$ gas controlled by the MFC 241c ranges, for example, from 100 sccm to 10,000 sccm. A flow rate of supplied $N_2$ gas controlled by the MFCs 241e through 241h ranges, for example, from 100 sccm to 10,000 sccm. In this case, a partial pressure of $O_2$ gas in the process chamber 201 ranges, for example, from 0.01 Pa to 5,941 Pa. A time for which $O_2$ gas is supplied to the wafer 200, that is, a gas supply time (radiation time), ranges, for example, from 1 to 200 seconds, preferably 1 to 120 seconds, and more preferably 1 to 60 seconds. In this case, the temperature of the heater 207 is set such that a temperature of the wafer 200 ranges, for example, from of 250° C. to 700° C., and preferably 300° C. to 650° C. as in steps S11 through S13. Under the above conditions, $O_2$ gas is thermally activated. Also, when $O_2$ gas is thermally activated and then supplied, a soft reaction may be generated and thus oxidizing to be described below may be softly performed.

In this case, a gas flowing in the process chamber 201 is thermally activated $O_2$ gas, and no HCDS gas or $C_3H_6$ gas flows in the process chamber 201. Therefore, $O_2$ gas does not cause a gas-phase reaction and is supplied to the wafer 200 in an active state and reacts with at least a part of the second layer (a layer containing the first carbon-containing layer, the silicon-containing layer and the second carbon-containing layer) containing silicon and carbon formed on the wafer 200 in step S13. Therefore, the second layer is thermally oxidized to non plasma and is changed (modified) to the third layer containing silicon, oxygen and carbon, that is, a silicon oxycarbide layer (SiOC layer).

In this case, the second layer is not saturated with the oxidation reaction. For example, when the first carbon-containing layer having a thickness of less than one atomic layer is formed in step S11, the silicon-containing layer having a thickness of several atomic layers is formed in step S12, and the second carbon-containing layer having a thickness of less than one atomic layer is formed in step S13, at least a part of the surface layer (one atomic layer of the surface) is oxidized. In this case, oxidation is performed under conditions in which the second layer is not saturated with the oxidation reaction such that the entire second layer is not oxidized. Also, depending on conditions, several layers below the surface layer of the second layer may be oxidized. However, oxidizing only the surface layer is preferable since controllability of a composition ratio of the SiOCN film may be increased. Also, for example, when the first carbon-containing layer having a thickness of less than one atomic layer is formed in step S11, the silicon-containing layer having a thickness of one atomic layer or less than one atomic layer is formed in step S12 and the second carbon-containing layer having a thickness of less than one atomic layer is formed in step S13, a part of the surface layer is similarly oxidized. In this case, oxidation is performed under conditions in which the second layer is not saturated with the oxidation reaction such that the entire second layer is not oxidized.

Also, in order to not saturate the second layer with the oxidation reaction, process conditions in step S14 are preferably set as the above-described process conditions. However, when the process conditions in step S14 are set as the following process conditions, it is easy to not saturate the second layer with the oxidation reaction.

Wafer temperature: 500° C. to 650° C.
Inner pressure of the process chamber: 133 Pa to 5,332 Pa
$O_2$ gas partial pressure: 12 Pa to 5,030 Pa
Flow rate of supplied $O_2$ gas: 1,000 sccm to 5,000 sccm
Flow rate of supplied $N_2$ gas: 300 sccm to 10,000 sccm
$O_2$ gas supply time: 6 to 200 seconds.

Meanwhile, in this case, particularly when a dilution rate of $O_2$ gas is increased (a concentration is decreased), a supply time of $O_2$ gas decreases, or a partial pressure of $O_2$ gas is decreased to regulate the above-described process conditions, it is possible to appropriately decrease oxidizing power in step S14, and the second layer is easy to not saturate with the oxidation reaction, which is preferable. A film formation sequence in FIG. 12 exemplifies a case in which a flow rate of supplied $N_2$ gas supplied in step S14 is higher than a flow rate of supplied $N_2$ gas supplied in the other steps, and thus a partial pressure of $O_2$ gas decreases and oxidizing power decreases.

When oxidizing power in step S14 decreases, it is easy to suppress carbon (C) from being desorbed from the second layer during oxidation. Since a Si—O bond has higher bond energy than a Si—C bond, when the Si—O bond is formed, the Si—C bond tends to be broken. However, when oxidizing power appropriately decreases in step S14, it is possible to suppress the Si—C bond from being disconnected when the Si—O bond is formed in the second layer, and C, whose bond with Si is disconnected, is easily suppressed from being desorbed from the second layer.

Also, when oxidizing power in step S14 decreases, Si remains exposed at the second layer after oxidation treatment, that is, the outermost surface of the third layer. When Si is exposed at the outermost surface of the third layer, it is easy to nitride the outermost surface of the third layer in step S15 to be described below. For example, when the Si—O bond or the Si—C bond is formed in the entire outermost surface of the third layer and Si is not exposed at the outermost surface, the Si—N bond is not easily formed under conditions of step S15 to be described below. However, when Si remains exposed at the outermost surface of the third layer, that is, when there is Si that may bind to N in the outermost surface of the third layer under conditions of step S15 to be described below, it is easy to form the Si—N bond.

(Residual Gas Removal)

After the third layer is formed, the valve 243c is closed to stop supply of $O_2$ gas. In this case, while the APC valve 244 is opened, the inside of the process chamber 201 is vacuum-exhausted by the vacuum pump 246, and an unreacted gas remaining in the process chamber 201, $O_2$ gas that has contributed to formation of the third layer or reaction by-products are removed from the inside of the process chamber 201. Also, in this case, while the valves 243e through 243h are opened, supply of $N_2$ gas serving as the inert gas into the process chamber 201 continues. $N_2$ gas serves as the purge gas. Therefore, it is possible to increase an effect of removing an unreacted gas remaining in the process chamber 201, $O_2$ gas that has contributed to formation of the third layer or reaction by-products from the inside of the process chamber 201.

Also, in this case, the gas remaining in the process chamber 201 may not be completely removed, and the inside of the process chamber 201 may not be completely purged. When an amount of the gas remaining in the process chamber 201 is small, there is no negative influence on step S15 performed thereafter. In this case, there is no need to set a flow rate of $N_2$ gas supplied into the process chamber 201 to be high. For example, when the same amount of $N_2$ gas as a volume of the reaction tube 203 (the process chamber 201) is supplied, it is possible to purge to the extent that there is no negative influence on step S15. When the inside of the process chamber 201 is not completely purged in this manner, a purge time may decrease and throughput may be improved. Also, it is possible to suppress unnecessary consumption of $N_2$ gas to a minimum.

As the oxidizing gas, in addition to oxygen ($O_2$) gas, water vapor ($H_2O$) gas, nitric oxide (NO) gas, nitrous oxide ($N_2O$) gas, nitrogen dioxide ($NO_2$) gas, carbon monoxide (CO) gas, carbon dioxide ($CO_2$) gas, ozone ($O_3$) gas, a mixed gas of hydrogen ($H_2$) gas and $O_2$ gas, a mixed gas of $H_2$ gas and $O_3$ gas or the like may be used.

[Step S15]

($NH_3$ Gas Supply)

Step S14 ends, the residual gas in the process chamber 201 is removed and then thermally activated $NH_3$ gas is supplied to the wafer 200. Process sequences and process conditions in this case are almost the same as the process sequences and process conditions when $NH_3$ gas is supplied in the above-described surface modifying step S10. However, a time for which $NH_3$ gas is supplied to the wafer 200, that is, a gas supply time (radiation time) ranges, for example, from 1 to 200 seconds, preferably 1 to 120 seconds, and more preferably 1 to 60 seconds. Also, in step S15, $NH_3$ gas is thermally activated and then supplied. When $NH_3$ gas is thermally activated and then supplied, a soft reaction may be generated and thus nitration to be described below may be softly performed.

In this case, a gas flowing in the process chamber 201 is thermally activated $NH_3$ gas, and no HCDS gas, $C_3H_6$ gas or $O_2$ gas flows in the process chamber 201. Therefore, $NH_3$ gas does not cause a gas-phase reaction, is supplied to the wafer 200 in an active state and reacts with at least a part of a layer containing silicon, oxygen and carbon that is formed on the wafer 200 as the third layer in step S14. Therefore, the third layer is thermally nitrided to non plasma and is changed (modified) to a fourth layer containing silicon, oxygen, carbon and nitrogen, that is, a silicon oxycarbonitride layer (SiOCN layer).

Also, when activated $NH_3$ gas is supplied to the wafer 200, the outermost surface of the third layer is modified (surface modifying process) during nitration of the third layer. Specifically, when $NH_3$ gas is adsorbed onto the outermost surface of the third layer, the adsorption layer of $NH_3$ gas is formed on the outermost surface of the third layer, that is, the outermost surface of the fourth layer. Also, at this time, when the outermost surface of the third layer reacts with activated $NH_3$ gas and is nitrided, a layer containing the Si—N bond, that is, the nitride layer (silicon nitride layer) containing silicon (Si) and nitrogen (N), may be additionally formed on the outermost surface of the third layer, that is, the outermost surface of the fourth layer. That is, both the nitride layer and the adsorption layer of $NH_3$ gas may be formed on the outermost surface of the third layer, that is, the outermost surface of the fourth layer.

A state of the outermost surface of the third layer on which the surface modifying process has been performed during nitration, that is, the outermost surface of the fourth layer, becomes a surface state in which HCDS gas supplied in step S12 in the next cycle is easily adsorbed and Si is easily deposited. That is, $NH_3$ gas used in step S15 serves as an adsorption and deposition accelerating gas that accelerates adsorption or deposition of HCDS gas or Si onto the outermost surface of the fourth layer (the outermost surface of the wafer 200) in the next cycle.

Also, in this case, the third layer should not be saturated with the nitriding reaction. For example, when the third layer having a thickness of several atomic layers is formed in steps S11 through S14, at least a part of the surface layer (one atomic layer of the surface) is nitrided. In this case, nitration is performed under conditions in which the nitriding reaction does not saturate the third layer such that the entire third layer is not nitrided. Also, depending on conditions, several layers below the surface layer of the third layer may be nitrided. However, nitriding only the surface layer is preferable since controllability of a composition ratio of the SiOCN film may be increased. Also, for example, when the third layer having a thickness of one atomic layer or less than one atomic layer is formed in steps S11 through S14, a part of the surface layer is similarly nitrided. In this case, nitration is performed under conditions in which the third layer is not saturated with the nitriding reaction such that the entire third layer is not nitrided.

Also, in order to not saturate the third layer with the nitriding reaction, process conditions in step S15 may be set as the above-described process conditions. However, when the process conditions in step S15 are set as the following process conditions, it is easy to not saturate the third layer with the nitriding reaction.

Wafer temperature: 500° C. to 650° C.
Inner pressure of the process chamber: 133 Pa to 5,332 Pa
Partial pressure of $NH_3$ gas: 33 Pa to 5,030 Pa
Flow rate of supplied $NH_3$ gas: 1,000 sccm to 5,000 sccm
Flow rate of supplied $N_2$ gas: 300 sccm to 3,000 sccm
$NH_3$ gas supply time: 6 to 200 seconds.

(Residual Gas Removal)

After the fourth layer is formed, the inside of the process chamber 201 is vacuum-exhausted and an unreacted gas remaining in the process chamber 201, $NH_3$ gas that has contributed to formation of the fourth layer or reaction by-products are removed from the inside of the process chamber 201. In this case, process sequences and process conditions are the same process sequences and process conditions when the residual gas is removed in the above-described surface modifying step S10.

As the nitriding gas, as in the surface modifying step S10, in addition to $NH_3$ gas, $N_2H_2$ gas, $N_2H_4$ gas, $N_3H_8$ gas or the like may be used.

When the above-described steps S11 through S15 are set to one cycle and this cycle is performed once or more, it is possible to form a thin film that has a predetermined film thickness and contains silicon, oxygen, carbon and nitrogen, that is, the SiOCN film on the wafer 200. Also, it is preferable that the above-described cycle be performed a plurality of times. That is, preferably, a thickness of the SiOCN layer that is formed per one cycle is smaller than a desired film thickness, and the above-described cycle is performed a plurality of times to obtain the desired film thickness.

Also, when the cycle is performed a plurality of times, if it is described in step S11 after a second cycle that "the first carbon-containing layer is formed on a part of the outermost surface of the wafer 200 that is modified by $NH_3$ gas in the surface modifying step S10" it means that "the first carbon-containing layer is formed on the outermost surface of the third layer modified by $NH_3$ gas in step S15, that is, a part of the outermost surface of the fourth layer." When it is described that "at least a part of the first carbon-containing layer is formed by replacing a part of $NH_3$ gas adsorbed onto at least a part of the outermost surface of the wafer 200 modified by $NH_3$ gas in the surface modifying step S10 with $C_3H_6$ gas" it means that "at least a part of the first carbon-containing layer is formed by replacing a part of $NH_3$ gas adsorbed onto the outermost surface of the third layer modified by $NH_3$ gas in step S15, that is, at least a part of the outermost surface of the fourth layer, with $C_3H_6$ gas."

That is, when the cycle is performed a plurality of times, if it is described that "a predetermined gas is supplied to the wafer 200" in each step at least after a second cycle, it means that "a predetermined gas is supplied to the layer formed on the wafer 200, that is, to the outermost surface of the wafer 200 as the laminate." When it is described that "a predetermined layer is formed on the wafer 200," it means that "a predetermined layer is formed on the layer formed on the wafer 200, that is, on the outermost surface of the wafer 200 as the laminate." These are the same as the above descriptions and will be the same in other film formation sequences and each modification to be described below.

Also, when the SiOCN film is formed in this film formation sequence, $C_3H_6$ gas is supplied twice per cycle in a divided manner (divided into two steps). That is, $C_3H_6$ gas is supplied twice (divided into steps S11 and S13) before and after step S12 of supplying HCDS gas. Therefore, it is easy to control a N concentration or a C concentration in the SiOCN film, and in particular, the C concentration. For example, the N concentration in the SiOCN film is decreased, and the C concentration is easily increased.

However, a process of supplying $C_3H_6$ gas may be performed only once per cycle. For example, step S11 may be performed, but step S13 may not be performed, or step S13 may be performed, but step S11 may not be performed. That is, at least one of step S11 and step S13 may be performed. Also, when only one step is performed, performing step S13 is preferable since controllability of the C concentration may be increased.

Also, when the SiOCN film is formed in this film formation sequence, if process conditions such as a inner pressure of the process chamber 201 and a gas supply time in each step are controlled, each element component, that is, ratios of a Si component, an O component, a C component, a N component in the SiOCN layer, that is, it is possible to regulate a Si concentration, an O concentration, a C concentration and a N concentration. Therefore, it is possible to control a composition ratio of the SiOCN film.

For example, when a gas supply time of $C_3H_6$ gas in step S11 or a partial pressure or a concentration of $C_3H_6$ gas in the process chamber 201 in step S11 is controlled, it is possible to control a desorption amount of $NH_3$ gas from the adsorption layer of $NH_3$ gas formed on the outermost surface of the wafer 200 (or the outermost surface of the fourth layer) that is modified, and an adsorption amount of $C_3H_6$ gas onto the outermost surface of the wafer 200 (or the outermost surface of the fourth layer) that is modified. Therefore, it is possible to finely regulate the N concentration and the C concentration in the SiOCN film. For example, when a gas supply time of $C_3H_6$ gas in step S11 is longer or a partial pressure or a concentration of $C_3H_6$ gas in the process chamber 201 in step S11 is increased, it is possible to increase a desorption amount of $NH_3$ gas from the adsorption layer of $NH_3$ gas formed on the outermost surface of the wafer 200 (or the outermost surface of the fourth layer) that is modified or increase an adsorption amount of $C_3H_6$ gas onto the outermost surface of the wafer 200 (or the outermost surface of the fourth layer) that is modified. Therefore, in the SiOCN film, the N concentration may decrease and the C concentration may increase. However, when a gas supply time of $C_3H_6$ gas in step S11 is too long, a film formation rate of the SiOCN film is considered to be decreased. Accordingly, a gas supply time of $C_3H_6$ gas in step S11 is preferably, for example, the same as or shorter than a gas supply time of $C_3H_6$ gas in step S13.

Also, for example, when a gas supply time of $C_3H_6$ gas in step S13 or a partial pressure or a concentration of $C_3H_6$ gas in the process chamber 201 in step S13 is controlled, it is possible to control an adsorption amount of $C_3H_6$ gas onto the outermost surface of the wafer 200 (or the outermost surface of the first layer) in step S13 or an oxidation amount in step S14. Therefore, it is possible to finely regulate the C concentration and the O concentration in the SiOCN film. For example, when a gas supply time of $C_3H_6$ gas in step S13 or a partial pressure or a concentration is regulated as an appropriate value, and an adsorption state of $C_3H_6$ onto the silicon-containing layer is set as an appropriate unsaturated state, that is, when the second carbon-containing layer is an appropriate discontinuous layer, it is possible to maintain a state in which silicon is appropriately exposed on the surface of the second layer. Therefore, it is possible to appropriately proceed with the oxidation reaction in step 514.

As a result, the O concentration, the C concentration and the N concentration in the SiOCN film may be appropriately controlled. For example, while the O concentration in the SiOCN film is suppressed from decreasing, the N concentration may decrease or the C concentration may increase. Also, for example, even when a film formation temperature of the SiOCN film decreases, it is possible to suppress or decrease an increase in a dielectric constant of the SiOCN film.

(Purging and Restoring to Atmospheric Pressure)

When a film formation process of forming the SiOCN film that includes a predetermined composition and has a predetermined film thickness is performed, the inert gas such as $N_2$ is supplied into the process chamber 201 and exhausted, and thus the inside of the process chamber 201 is purged by the inert gas (gas purge). Then, an atmosphere in the process chamber 201 is replaced with the inert gas (inert gas replacement), and the inner pressure of the process chamber 201 is restored to a normal pressure (restoration to atmospheric pressure).

(Boat Unloading and Wafer Discharge)

Then, the seal cap 219 is lowered by the boat elevator 115, the lower end of the manifold 209 is opened and the processed wafer 200 is unloaded (boat unloading) to the outside of the process chamber 201 through the lower end of the manifold 209 while being held on the boat 217. Then, the processed wafer 200 is extracted from the boat 217 (wafer discharge).

(3) Cleaning Method

When the thin film forming process is repeated, a thin film such as the SiOCN film accumulates in the process chamber 201 such as the inner wall of the reaction tube 203. That is, a deposition containing the thin film is adhered to the inner wall and the like. At a time at which a thickness of the deposition (accumulated thin film) adhered to the inner wall and the like becomes a predetermined thickness before the deposition is detached and falls, cleaning of the inside of the process chamber 201 is performed.

As described above, when a process gas (film formation gas) is supplied into the process chamber 201 through the inert gas supply system serving as the furnace port portion purge gas supply system, the inert gas for furnace port portion purge is ejected through the gap 37 (the first ejection port) or the ejection hole 41a (the second ejection port) of the porous ring 41. Therefore, the process gas in contact with the vicinity of the opening 201a (furnace port) of the process chamber 201 is suppressed. When cleaning is performed, in order to prevent a metal member (such as the manifold 209, the seal cap 219 or the rotational shaft 255) of the furnace port portion from being corroded due to a cleaning gas, the inert gas is ejected through the inert gas supply system serving as the furnace port portion purge gas supply system.

In this case, when by-products are adhered to an inner wall surface of the furnace port portion, if the inert gas is ejected through the ejection hole 41a at the same flow rate when the process gas (film formation gas) is supplied, the cleaning gas does not easily come in contact with the inner wall surface of the furnace port portion to which by-products are adhered, and cleaning may not be sufficiently performed. Therefore, if by-products are adhered to the inner wall surface of the furnace port portion, when the cleaning gas is supplied into the reaction tube 203, the inert gas to be ejected through the ejection hole 41a preferably has a lower flow rate than when the process gas is supplied. That is, when film formation is performed, in order to prevent by-products from being adhered, a flow rate of the inert gas to be ejected through the ejection hole 41a is high. Nevertheless when by-products are adhered to the inner wall surface of the furnace port portion, in order to sufficiently perform cleaning during cleaning, a flow rate of the inert gas to be ejected through the ejection hole 41a is preferably low. Also, when by-products are not adhered to the inner wall surface of the furnace port portion during cleaning, there is no need to set a lower flow rate of the inert gas to be ejected through the ejection hole 41a than when the process gas is supplied, but the same flow rate when the process gas is supplied is preferably set.

Hereinafter, a method of cleaning the inside of the process chamber 201 will be described. Also, in the following description, operations of components of the substrate processing apparatus are controlled by the controller 121.

Cleaning is performed by sequentially performing a process (first step S31 (etch process of the thin film)) in which the cleaning gas, for example, only fluorine ($F_2$) gas serving as a fluorine-based gas or only $F_2$ gas diluted with the inert gas, is supplied into the process chamber 201 heated to a first temperature to remove the thin film deposited (accumulated) in the process chamber 201 and a process (second step S32 (treatment process)) in which only $F_2$ gas or only $F_2$ gas diluted with the inert gas is supplied as the cleaning gas into the process chamber 201 heated to a second temperature to remove a deposit remaining in the process chamber 201 after the thin film is removed. In this case, as described above, in the first step S31 and second step S32, the inert gas is ejected to the vicinity of the furnace port through the inert gas supply system serving as the furnace port portion purge gas supply system. Also, supply of the inert gas through the furnace port portion purge gas supply system is continuously performed at least until cleaning is completed. Hereinafter, each of the first step S31 and second step S32 will be described.

[First Step (S31)]

The empty boat 217, that is, the boat 217 in which the wafer 200 is not loaded, is raised by the boat elevator 115 is loaded (boat loading) into the process chamber 201. In this state, the lower end of the manifold 209 is sealed by the seal cap 219 through the O-ring 220.

Vacuum exhaust is performed by the vacuum pump 246 such that the inside of the process chamber 201 has a desired pressure (degree of vacuum), that is, a first pressure. In this case, the inner pressure of the process chamber 201 is measured by the pressure sensor 245. Based on the measured pressure, the APC valve 244 is feedback-controlled. Also, the inside of the process chamber 201 is heated to a desired temperature, that is, the first temperature, by the heater 207. In this case, based on temperature information detected by the temperature sensor 263, power supply to the heater 207 is feedback-controlled such that the temperature in the process chamber 201 has a desired temperature distribution. The pressure and the temperature in the process chamber 201 reach the first pressure and the first temperature, and then control is performed to maintain the pressure and the temperature. Next, the rotating mechanism 267 rotates the boat 217. Also, the boat 217 may not be rotated.

Then, while the temperature and the inner pressure of the process chamber 201 are maintained at the first temperature and the first pressure, $F_2$ gas serving as the cleaning gas is supplied into the process chamber 201 through a cleaning gas supply pipe 232$k$. That is, the valve 243$k$ is opened, and $F_2$ gas flowing in the cleaning gas supply pipe 232$k$ is controlled by the MFC 241$k$ to have a desired flow rate and is introduced into the process chamber 201 through the nozzle 249$a$ with the gas supply pipe 232$a$ therebetween.

In this case, at the same time, through the inert gas supply pipe 232$e$, $N_2$ gas serving as the inert gas may be supplied into the process chamber 201 to dilute $F_2$ gas. In this case, for example, when the valve 243$e$ is opened, $N_2$ gas supplied into the inert gas supply pipe 232$e$ is controlled by the MFC 241$e$ to have a desired flow rate, and then is introduced into the process chamber 201 through the nozzle 249$a$ with the gas supply pipe 232$a$ therebetween. $N_2$ gas is mixed with $F_2$ gas in the gas supply pipe 232$a$. When a flow rate of supplied $N_2$ gas is controlled, a concentration of $F_2$ gas may also be controlled.

$F_2$ gas or diluted $F_2$ gas introduced into the process chamber 201 through the nozzle 249$a$ is lowered into the process chamber 201 and is exhausted through the exhaust pipe 231. When $F_2$ gas or diluted $F_2$ gas passes through the inside of the process chamber 201, it comes in contact with the deposition including the thin film such as the SiOCN film accumulated on the inner wall of the reaction tube 203 or a surface of the boat 217. In this case, the deposition including the thin film is removed according to a thermochemical reaction. That is, the deposition including the thin film is removed according to an etching reaction between active species generated when $F_2$ gas is pyrolyzed and the deposition.

In the first step S31 (etch process of the thin film), exemplary etch conditions of the thin film are as follows. Each of the etch conditions keeps a constant value in each range. First temperature: 350° C. to 450° C., first pressure: 6,650 Pa (50 Torr) to 26,600 Pa (200 Torr), and preferably, 13,300 Pa (100 Torr) or more to 19,950 Pa (150 Torr), $F_2$ gas supply flow rate: 0.5 slm to 5 slm, $N_2$ gas supply flow rate: 1 slm to 20 slm.

[Second Step S32]

An etch time of a predetermined thin film elapses and the first step S31 ends. Subsequently, the process advances to the second step S32. In the second step S32 serving as a treatment process, after the first step S31 serving as the etch process of the thin film, the deposit remaining in the process chamber 201 is removed and a surface of a quartz member in the process chamber 201 is slightly etched for smoothing. That is, a quartz crack generated at a surface of the quartz member of the reaction tube 203 or the boat 217, fine quartz particles (quartz powder) that are generated by the quartz crack and the like and adhered to a surface of a member in the process chamber 201, or a deposit such as a residual silicon nitride film is removed.

Exemplary treatment conditions in the second step (treatment process) are as follows. Each of the treatment conditions keeps a constant value in each range.

Second temperature: 400° C. to 500° C.

Second pressure: 6,650 Pa (50 Torr) to 26,600 Pa (200 Torr), and preferably, 13,300 Pa (100 Torr) or more to 19,950 Pa (150 Torr)

$F_2$ gas supply flow rate: 0.5 slm to 5 slm $N_2$ gas supply flow rate: 1 slm to 20 slm.

Effects of the Present Embodiment

According to this embodiment, one or a plurality of effects to be described will be obtained.

(a) The throttle unit configured to throttle a channel in which the inert gas flows is provided at at least one of the first supply pipe and the second supply pipe. The first supply pipe is configured to supply the inert gas to the first ejection part that ejects the inert gas into the process vessel through the center portion of the seal cap. The second supply pipe is configured to supply the inert gas to the second ejection part that ejects the inert gas toward the inner wall surface of an opening of the end of the process vessel. When the process gas is supplied into the process vessel, the inert gas is ejected into the process vessel by the first ejection part and the inert gas is ejected toward the inner wall surface by the second ejection part. According to such a configuration, it is easy to regulate a flow rate of the inert gas ejected by the first ejection part and a flow rate of the inert gas ejected by the second ejection part appropriately. As a result, it is possible to suppress the process gas from coming in contact with the inner wall surface of the opening of the end of the process vessel appropriately and it is possible to suppress by-products from being adhered appropriately.

(b) The first ejection part includes the first ejection port that is open to an upper portion in the process vessel. The second ejection part includes a plurality of second ejection ports that are open to the inner wall surface of the opening of the end of the process vessel. According to such a configuration, it is possible to eject the inert gas in a more effective direction.

(c) The process vessel is configured to include the manifold that supports the reaction tube and the reaction tube. An end of the opening side of the process vessel is configured by the manifold. Accordingly, it is possible to eject the inert gas to the inner wall surface of the manifold.

(d) The substrate support configured to support the substrate, the rotational shaft provided to penetrate the seal cap and configured to support and rotate the substrate support, and the rotating mechanism provided at the rotational shaft and configured to rotate the rotational shaft are further included. The first ejection part includes a gap between the rotational shaft and the seal cap. According to such a configuration, it is possible to effectively protect the rotating mechanism from the process gas.

(e) The second ejection part is configured as a hollow ring shape member including a plurality of second ejection ports. Therefore, it is possible to eject the inert gas more effectively.

(f) The second ejection part is configured as the hollow ring shape member including the plurality of second ejection ports and is concentrically disposed with respect to the process vessel in a plan view. According to such a configuration, it is possible to eject the inert gas more effectively.

(g) The second ejection part is provided at the seal cap. According to such a configuration, it is easy to eject the inert gas to the lower end of the inner wall surface of the opening of the end of the process vessel.

(h) Since the second supply pipe is configured to penetrate the seal cap, it is easy to supply the inert gas to the second ejection part.

(i) The throttle unit is provided at the first supply pipe. According to such a configuration, it is possible to supply the inert gas having a greater flow rate than that of the first ejection part to the second ejection part.

(j) When the cleaning gas is supplied into the process vessel, the inert gas is ejected by the first ejection part and the second ejection part. Therefore, it is possible to suppress the cleaning gas from coming in contact with the inner wall surface of the opening of the end of the process vessel and the like and it is possible to suppress these members from being corroded.

(k) When by-products are adhered to the inner wall surface of the opening of the end of the process vessel, a flow rate of the inert gas ejected by the second ejection part when the cleaning gas is supplied into the process vessel is lower than a flow rate of the inert gas ejected by the second ejection part when the process gas is supplied into the process vessel. According to such a configuration, it is possible to sufficiently perform cleaning on the inner wall surface of the opening of the end of the process vessel.

(l) When the process gas inlet port configured to introduce the process gas into the process vessel, the exhaust port and the seal cap are sequentially disposed from the top, and the second ejection port is disposed below the exhaust port. Therefore, it is possible to suppress the process gas from coming in contact with the inner wall surface of the opening of the end of the process vessel positioned in the vicinity of the seal cap appropriately.

Also, it is needless to say that the present invention is not limited to the above-described embodiment, but may be variously modified without departing from the scope of the invention. For example, while the above-described embodiment has exemplified a case in which the exhaust pipe is provided at the reaction tube and the nozzle is provided at the manifold, the present invention is not limited thereto, but may be applied when the exhaust pipe is provided at the manifold or the nozzle is provided at the reaction tube.

Also, while the above-described embodiment has exemplified the batch type vertical film formation apparatus that processes a plurality of substrates at the same time, the present invention is not limited thereto, but may be applied to a single wafer type film formation apparatus that processes one or several substrates at a time. That is, the present invention may be generally applied to substrate processing apparatuses in which by-products are generated.

Also, while the above-described embodiment has exemplified the case in which HCDS gas, $C_3H_6$ gas, $O_2$ gas and $NH_3$ gas are supplied through separate nozzles, the nozzle may be shared by a plurality of gases. When the plurality of gases share the nozzle, since the number of nozzles decreases a device cost may decrease and maintenance becomes easy. For example, $C_3H_6$ gas, $O_2$ gas and $NH_3$ gas may be supplied through the same nozzle. Also, for example, HCDS gas and $C_3H_6$ gas may be supplied through the same nozzle, and $O_2$ gas and $NH_3$ gas may be supplied through the same nozzle. However, in the temperature range in the above-described embodiment, HCDS gas is considered not to react with $C_3H_6$ gas, but is considered to react with $O_2$ gas or $NH_3$ gas. Therefore, HCDS gas is preferably supplied through a separate nozzle from $O_2$ gas and $NH_3$ gas.

According to such a configuration, it is possible to suppress deposition of by-products in the substrate processing apparatus.

Hereinafter, preferred embodiments according to the present invention are supplementarily noted.

<Supplementary Note 1>

According to an aspect of the present invention, there is provided a substrate processing apparatus including:
 a process vessel configured to process a substrate;
 a process gas supply system configured to supply a process gas into the process vessel;
 an inert gas supply system configured to supply an inert gas into the process vessel;
 a seal cap configured to close an opening of the process vessel; and
 a controller configured to control the process gas supply system and the inert gas supply system,
 wherein the inert gas supply system includes:
  a first ejection part installed at a center portion of the seal cap and configured to eject the inert gas;
  a second ejection part installed to face an inner wall surface of the opening at an end portion of the process vessel and configured to eject the inert gas;
  a first supply pipe configured to supply the inert gas to the first ejection part;
  a second supply pipe configured to supply the inert gas to the second ejection part;
  a third supply pipe configured to supply the inert gas to the first pipe and the second pipe;
  a flow rate controller installed at the third supply pipe and configured to control a flow rate of the inert gas; and
  a throttle unit installed at at least one of the first supply pipe and the second supply pipe and configured to throttle a channel where the inert gas flows, and
 wherein the controller is configured to control the process gas supply system and the inert gas supply system to: supply the inert gas having the flow rate thereof controlled by the flow rate controller to the first supply pipe and the second supply pipe through the third supply pipe; eject the inert gas supplied to the first supply pipe into the process vessel through the first ejection part installed at the center portion of the seal cap; and eject the inert gas supplied to the second supply pipe to the inner wall surface of the opening at the end portion of the process vessel through the second ejection part while the process gas is supplied into the process vessel.

<Supplementary Note 2>

In the substrate processing apparatus of Supplementary note 1, preferably, the first ejection part includes a first ejection port formed toward an upper portion of the process vessel, and the second ejection part includes a plurality of second ejection ports facing the inner wall surface of the opening at the end portion of the process vessel.

<Supplementary Note 3>

In the substrate processing apparatus of any one of Supplementary notes 1 and 2, the process vessel includes a process tube and a manifold supporting the process tube, and the manifold defines the opening at the end portion of the process vessel.

<Supplementary Note 4>

In the substrate processing apparatus of any one of Supplementary notes 1 through 3, preferably, further including:
 a substrate support configured to support the substrate;
 a rotational shaft penetrating the seal cap and supporting and rotating the substrate support; and
 a rotation mechanism installed at the rotational shaft and configured to rotate the rotational shaft,
 wherein the first ejection part includes a gap between the rotational shaft and the seal cap.

<Supplementary Note 5>

In the substrate processing apparatus of any one of Supplementary notes 1 through 4, preferably, the second ejection part includes a hollow ring member including a plurality of second ejection ports.

<Supplementary Note 6>

In the substrate processing apparatus of any one of Supplementary notes 1 through 5, preferably, the second ejection part includes a hollow ring member including a plurality of second ejection ports and is arranged to be concentric with the process vessel (the seal cap and the manifold).

\<Supplementary Note 7\>

In the substrate processing apparatus of any one of Supplementary notes 1 through 6, preferably, the second ejection part is installed at the seal cap.

\<Supplementary Note 8\>

In the substrate processing apparatus of any one of Supplementary notes 1 through 7, preferably, the second supply pipe is installed to penetrate the seal cap.

\<Supplementary Note 9\>

In the substrate processing apparatus of any one of Supplementary notes 1 through 8, preferably, the throttle unit is installed at the first supply pipe.

\<Supplementary Note 10\>

In the substrate processing apparatus of any one of Supplementary notes 1 through 10, preferably, the throttle unit is installed at the first supply pipe, and a conductance of the first supply pipe is smaller than that of the second supply pipe.

\<Supplementary Note 11\>

In the substrate processing apparatus of any one of Supplementary notes 3 through 10, preferably, the manifold is made of metal.

\<Supplementary Note 12\>

In the substrate processing apparatus of any one of Supplementary notes 1 through 11, preferably, further includes cleaning gas supply system configured to supply a cleaning gas into the process vessel, wherein the controller is configured to control the process gas supply system, the cleaning gas supply system and the inert gas supply system in a manner that a flow rate of the inert gas ejected from the second ejection part when the cleaning gas is supplied into the process vessel is less than that of the inert gas ejected from the second ejection part when the process gas is supplied into the process vessel.

\<Supplementary Note 13\>

In the substrate processing apparatus of any one of Supplementary notes 2 through 12, preferably, further including:

a process gas inlet port configured to introduce the process gas into the process vessel through the process gas supply system; and an exhaust port disposed below the process gas inlet port and configured to exhaust an inside of the process vessel, wherein the process gas inlet port, the exhaust port and the seal cap are arranged in order from top to bottom, and the plurality of second ejection ports are arranged below the exhaust port.

\<Supplementary Note 14\>

According to another aspect of the present invention, there is provided a substrate processing method and a method of manufacturing a semiconductor device using a substrate processing apparatus including an inert gas supply system including: a first ejection part configured to eject an inert gas through a center portion of a seal cap; a second ejection part installed to face an inner wall surface of an opening at an end portion of a process vessel and configured to eject the inert gas; a first supply pipe configured to supply the inert gas to the first ejection part; a second supply pipe configured to supply the inert gas to the second ejection part; a third supply pipe configured to supply the inert gas to the first pipe and the second pipe; a flow rate controller installed at the third supply pipe and configured to control a flow rate of the inert gas; and a throttle unit installed at at least one of the first supply pipe and the second supply pipe and configured to throttle a channel where the inert gas flows, the method including:

(a) loading a substrate into the process vessel and closing the opening of the process vessel; and (b) processing the substrate by supplying the inert gas into the process vessel through the inert gas supply system while supplying a process gas into the process vessel through a process gas supply system, wherein, in (b), the inert gas having the flow rate thereof controlled by the flow rate controller is supplied to the first supply pipe and the second supply pipe through the third supply pipe; the inert gas supplied to the first supply pipe is ejected into the process vessel through the first ejection part installed at the center portion of the seal cap; and the inert gas supplied to the second supply pipe is ejected to the inner wall surface of the opening at the end portion of the process vessel through the second ejection part while the process gas is supplied into the process vessel.

\<Supplementary Note 15\>

According to still another aspect of the present invention, there is provided a program or a non-transitory computer-readable recording medium storing a program executed in a substrate processing apparatus including an inert gas supply system, the inert gas supply system including: a first ejection part configured to eject an inert gas through a center portion of a seal cap; a second ejection part installed to face an inner wall surface of an opening at an end portion of a process vessel and configured to eject the inert gas; a first supply pipe configured to supply the inert gas to the first ejection part; a second supply pipe configured to supply the inert gas to the second ejection part; a third supply pipe configured to supply the inert gas to the first pipe and the second pipe; a flow rate controller installed at the third supply pipe and configured to control a flow rate of the inert gas; and a throttle unit installed at at least one of the first supply pipe and the second supply pipe and configured to throttle a channel where the inert gas flows, the program causing the substrate processing apparatus to perform:

(a) loading a substrate into the process vessel and closing the opening of the process vessel; and (b) processing the substrate by supplying the inert gas into the process vessel through the inert gas supply system while supplying a process gas into the process vessel through a process gas supply system, wherein, in (b), the inert gas having the flow rate thereof controlled by the flow rate controller is supplied to the first supply pipe and the second supply pipe through the third supply pipe; the inert gas supplied to the first supply pipe is ejected into the process vessel through the first ejection part installed at the center portion of the seal cap; and the inert gas supplied to the second supply pipe is ejected to the inner wall surface of the opening at the end portion of the process vessel through the second ejection part while the process gas is supplied into the process vessel.

What is claimed is:

1. A substrate processing apparatus comprising:
a process vessel configured to process a substrate;
a process gas supply system configured to supply a process gas into the process vessel;
an inert gas supply system configured to supply an inert gas into the process vessel;
a seal cap configured to close an opening of the process vessel; and
a controller configured to control the process gas supply system and the inert gas supply system,
wherein the inert gas supply system comprises:
a first ejection part installed at a center portion of the seal cap and configured to eject the inert gas;
a second ejection part installed to face an inner wall surface of the opening at an end portion of the process vessel and configured to eject the inert gas;

a first supply pipe configured to supply the inert gas to the first ejection part;

a second supply pipe configured to supply the inert gas to the second ejection part;

a third supply pipe configured to supply the inert gas to the first pipe and the second pipe;

a flow rate controller installed at the third supply pipe and configured to control a flow rate of the inert gas; and a throttle unit installed at at least one of the first supply pipe and the second supply pipe and configured to throttle a channel where the inert gas flows, and wherein the controller is configured to control the process gas supply system and the inert gas supply system to: supply the inert gas having the flow rate thereof controlled by the flow rate controller to the first supply pipe and the second supply pipe through the third supply pipe; eject the inert gas supplied to the first supply pipe into the process vessel through the first ejection part installed at the center portion of the seal cap; and eject the inert gas supplied to the second supply pipe to the inner wall surface of the opening at the end portion of the process vessel through the second ejection part while the process gas is supplied into the process vessel.

2. The substrate processing apparatus of claim 1, wherein the first ejection part comprises a first ejection port formed toward an upper portion of the process vessel, and the second ejection part comprises a plurality of second ejection ports facing the inner wall surface of the opening at the end portion of the process vessel.

3. The substrate processing apparatus of claim 1, wherein the process vessel comprises: a process tube; and a manifold supporting the process tube, the manifold defining the opening at the end portion of the process vessel.

4. The substrate processing apparatus of claim 1, further comprising:

a substrate support configured to support the substrate;

a rotational shaft penetrating the seal cap and supporting and rotating the substrate support; and a rotation mechanism installed at the rotational shaft and configured to rotate the rotational shaft, wherein the first ejection part comprises a gap between the rotational shaft and the seal cap.

5. The substrate processing apparatus of claim 1, wherein the second ejection part comprises a hollow ring member including a plurality of second ejection ports.

6. The substrate processing apparatus of claim 5, wherein the second ejection part is arranged to be concentric with the process vessel.

7. The substrate processing apparatus of claim 6, wherein the second ejection part is installed at the seal cap.

8. The substrate processing apparatus of claim 7, wherein the second supply pipe is installed to penetrate the seal cap.

9. The substrate processing apparatus of claim 1, wherein the throttle unit is installed at the first supply pipe.

10. The substrate processing apparatus of claim 9, wherein a conductance of the first supply pipe is smaller than that of the second supply pipe.

11. The substrate processing apparatus of claim 1, further comprising: a cleaning gas supply system configured to supply a cleaning gas into the process vessel, wherein the controller is configured to control the process gas supply system, the cleaning gas supply system and the inert gas supply system in a manner that a flow rate of the inert gas ejected from the second ejection part when the cleaning gas is supplied into the process vessel is less than that of the inert gas ejected from the second ejection part when the process gas is supplied into the process vessel.

12. The substrate processing apparatus of claim 2, further comprising:

a process gas inlet port configured to introduce the process gas into the process vessel through the process gas supply system; and an exhaust port disposed below the process gas inlet port and configured to exhaust an inside of the process vessel, wherein the process gas inlet port, the exhaust port and the seal cap are arranged in order from top to bottom, and the plurality of second ejection ports are arranged below the exhaust port.

13. The substrate processing apparatus of claim 9, wherein the controller is configured to control the inert gas supply system in a manner that a flow rate of the inert gas ejected from the first ejection part is less than that of the inert gas ejected from the second ejection part.

14. The substrate processing apparatus of claim 5, wherein the plurality of second ejection ports are disposed at a position higher than a center line of the hollow ring member.

15. The substrate processing apparatus of claim 14, wherein the plurality of second ejection ports are disposed at a position closer to the inner wall surface than a vertical line of the hollow ring member.

* * * * *